(12) United States Patent  (10) Patent No.: US 9,310,407 B2
Soneda et al.  (45) Date of Patent: Apr. 12, 2016

(54) POWER STRIP AND POWER MEASUREMENT METHOD

(71) Applicants: FUJITSU LIMITED, Kawasaki-shi, Kanagawa (JP); FUJITSU COMPONENT LIMITED, Shinagawa-ku, Tokyo (JP)

(72) Inventors: Hiromitsu Soneda, Atsugi (JP); Osamu Tsuboi, Kawasaki (JP); Fumihiko Nakazawa, Kobe (JP); Naoyuki Nagao, Shinagawa (JP)

(73) Assignees: FUJITSU LIMITED, Kawasaki (JP); FUJITSU COMPONENT LIMITED, Tokyo (JP)

( * ) Notice: Subject to any disclaimer, the term of this patent is extended or adjusted under 35 U.S.C. 154(b) by 464 days.

(21) Appl. No.: 13/955,533

(22) Filed: Jul. 31, 2013

(65) Prior Publication Data

US 2013/0313899 A1  Nov. 28, 2013

Related U.S. Application Data

(63) Continuation of application No. PCT/JP2011/052409, filed on Feb. 4, 2011.

(51) Int. Cl.
*H02J 3/00* (2006.01)
*G01R 21/133* (2006.01)
(Continued)

(52) U.S. Cl.
CPC .......... *G01R 21/133* (2013.01); *H01R 13/6683* (2013.01); *H01R 25/003* (2013.01); *H02J 3/00* (2013.01); *H02J 2003/143* (2013.01); *Y02B 70/3266* (2013.01); *Y04S 20/242* (2013.01); *Y10T 307/25* (2015.04)

(58) Field of Classification Search
CPC .......................................................... H02J 3/00
USPC ......................................................... 307/140
See application file for complete search history.

(56) References Cited

U.S. PATENT DOCUMENTS 5,973,491 A  10/1999  Onizuka
8,115,423 B2  2/2012  Hanada et al.

FOREIGN PATENT DOCUMENTS

JP  09-189723 A  7/1997
JP  H9-266674  10/1997
(Continued)

OTHER PUBLICATIONS

Office Action mailed Aug. 5, 2014 from the Japanese Patent Office issued in counterpart application No. 2012-555672 with English translation.

(Continued)

*Primary Examiner* — Robert Deberadinis
(74) *Attorney, Agent, or Firm* — Kratz, Quintos & Hanson, LLP

(57) ABSTRACT

A power strip includes: jack portions; current meters each configured to measure a current being supplied from the corresponding jack portion to one of external electrical devices, and to output a measurement signal corresponding to a magnitude of the current; and a computing unit configured to obtain instantaneous values of the current at a plurality of time points on the basis of the measurement signal, and to calculate a power value using the instantaneous values. The computing unit configured to obtain the instantaneous values-of the current by using any one of a first zero point and a second zero point as a reference.

20 Claims, 28 Drawing Sheets

(51) Int. Cl.
*H01R 13/66* (2006.01)
*H01R 25/00* (2006.01)
*H02J 3/14* (2006.01)

(56) References Cited

FOREIGN PATENT DOCUMENTS

| JP | H9-294335 | 11/1997 |
| JP | 2002-098715 A | 4/2002 |
| JP | 2006-258745 A | 9/2006 |
| JP | 2010-008340 A | 1/2010 |
| JP | 2010-45945 A1 | 2/2010 |
| KR | 2010-94654 A | 8/2010 |

OTHER PUBLICATIONS

Office Action of China Application No. 201180066759.5 dated Feb. 2, 2015. Full Translation of the Office Action.
Notice of Preliminary Rejection from the Korean Intellectual Property Office dated May 22, 2014 issued in counterpart application No. 10-2013-7020601 with English translation.
International Search Report for International Application No. PCT/JP2011/052409 dated Mar. 1, 2011.

POWER STRIP AND POWER MEASUREMENT METHOD

CROSS-REFERENCE TO RELATED APPLICATION

This application is a continuation of International Patent Application No. PCT/JP2011/052409 filed Feb. 4, 2011 and designated the U.S., the entire contents of which are incorporated herein by reference.

FIELD

The embodiments discussed herein are related to a power strip and a power measurement method.

BACKGROUND

In recent years, saving of power consumption at home and office has been gaining momentum along with an increase in power demand and concerns about global environment. With the growing consciousness of energy saving, people make efforts to turn off the power supplies of electrical devices frequently, to revise the preset temperature of air conditioning, and to do the like.

In order to know how much energy is actually saved as a result of these efforts, there is a method using power meters provided to respective households.

However, the power meter for each household is provided to a power switchboard installed at a stage before the distribution of power to the inside of the house, and is not capable of measuring power consumption of each electrical device at home or office.

Moreover, power is usually distributed to a plurality of electrical devices via a power strip connected to a wall outlet at home or office. The commercially available power strip, however, does not have a function to individually measure the power consumption of each electrical device.

PATENT DOCUMENT 1: Japanese Laid-open Patent Publication No. 2010-45945

SUMMARY

According to an aspect of the disclosure, there is provided a power strip including: a jack portion; a current meter configured to measure a current being supplied from the jack portion to an external electrical device, and to output a measurement signal corresponding to a magnitude of the current; and a computing unit configured to obtain instantaneous values of the current at a plurality of time points on the basis of the measurement signal, and to calculate a power value using the instantaneous values. The computing unit configured to obtain the instantaneous values of the current by using any one of a first zero point and a second zero point as a reference.

Furthermore, according to another aspect of the disclosure, there is provided a power measurement method including: obtaining measured values of a current at a plurality of time points, the current being supplied from each of a plurality of jack portions to an external electrical device, and acquiring a measurement signal corresponding to the measured values; obtaining instantaneous values of the current at the plurality of time points from the measurement signal by using any one of a first zero point and a second zero point as a reference; and calculating a power value individually for each of the plurality of jack portions by using the instantaneous values.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

Hereinafter, a power strip according to a first embodiment and a power measurement method using the power strip are described with reference to the accompanying drawings.

Figure 1:
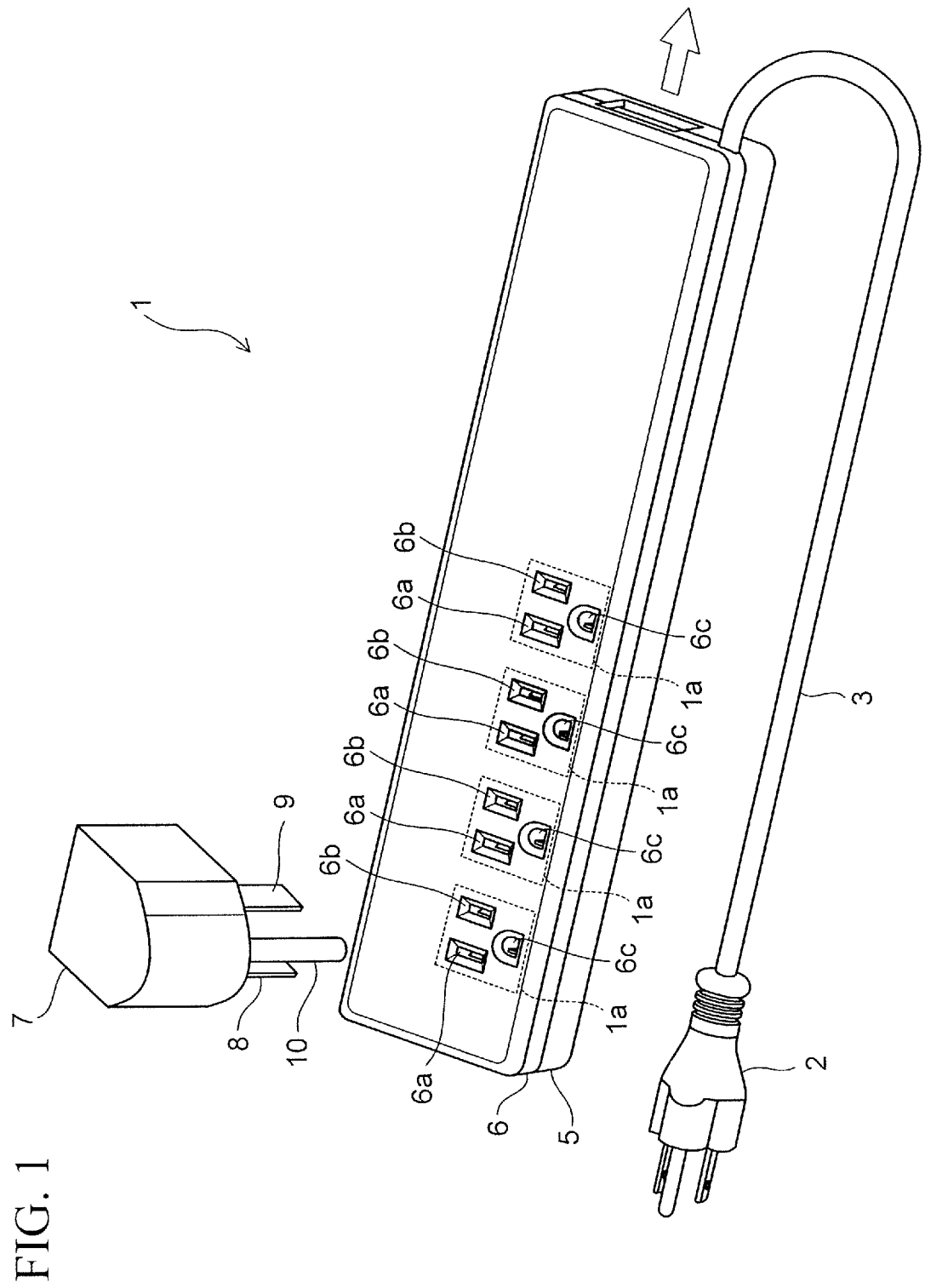
FIG. 1 is an external view of a power strip according to a first embodiment.

FIG. 1 is an external view of a power strip 1 according to this embodiment.

This power strip 1 includes a plug 2, a power cord 3, a lower casing 5, and an upper casing 6.

Among them, the upper casing 6 is provided with a plurality of jack portions 1a each corresponding to a plug 7. The plug 7 is provided to an external electrical device and includes a first plug blade 8, a second plug blade 9, and an earth terminal 10.

Each of the above jack portions 1a is provided with a first insertion port 6a into which the first plug blade 8 is to be inserted, a second insertion port 6b into which the second plug blade 9 is to be inserted, and a third insertion port 6c into which the earth terminal 10 is to be inserted.

In the above-described power strip 1, the plug 2 is inserted into an electric outlet installed in a wall surface or the like, and thereby a power supply voltage of the installed electric outlet is supplied to each of the jack portions 1a.

Figure 2:
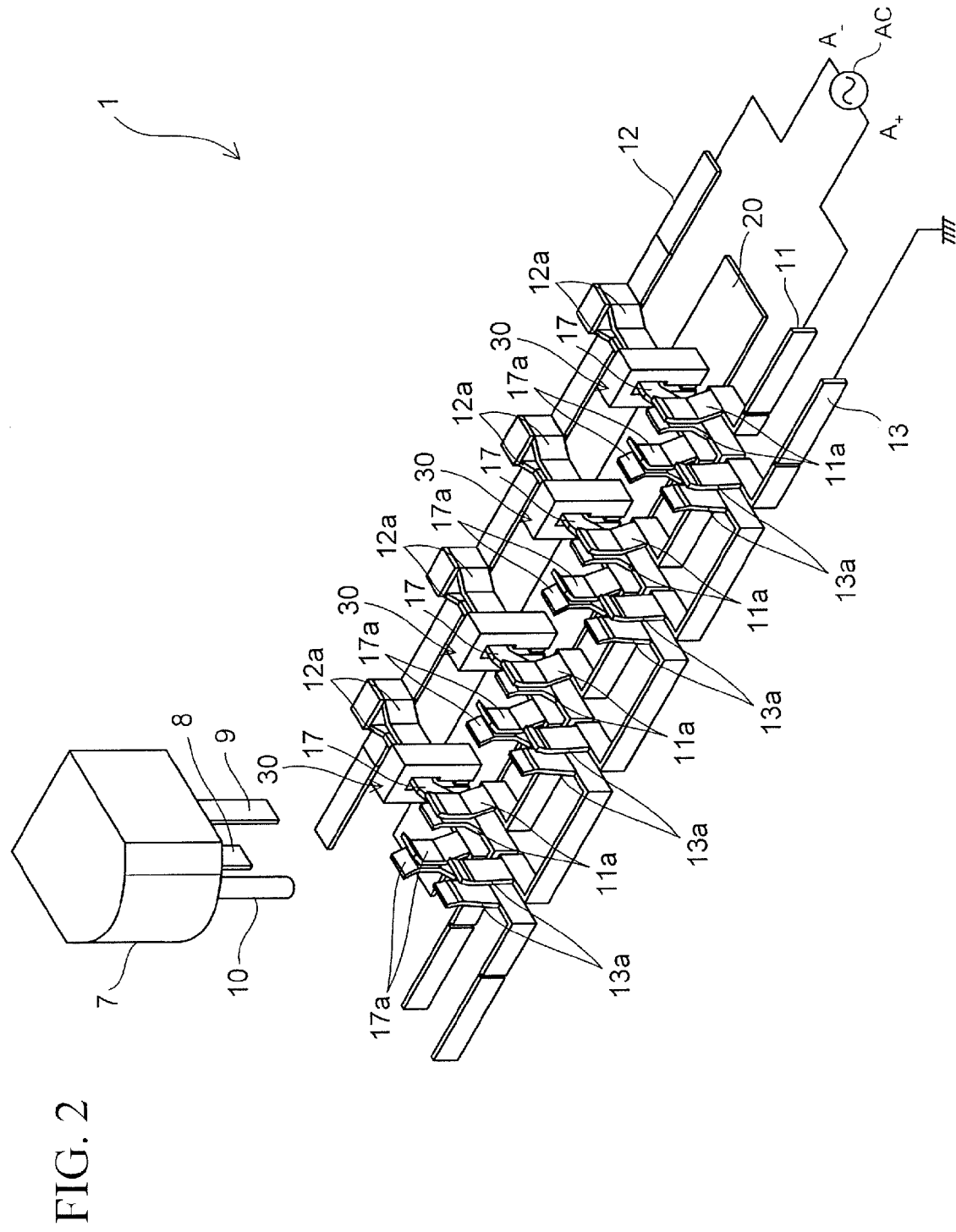
FIG. 2 is an external view of the power strip according to the first embodiment with its casings removed.

FIG. 2 is an external view of the power strip 1 with the casings 5 and 6 removed.

As illustrated in FIG. 2, the power strip 1 is provided with first to third bus bars 11 to 13. These bus bars 11 to 13 are each fabricated by die-cutting a metal plate such as a brass plate and then bending it, for example.

Among the bus bars 11 to 13, the first bus bar 11 and the second bus bar 12 serve as a first power line and a second power line, respectively, and are electrically connected to two electrodes $A_+$, $A_-$ of an AC power supply, respectively, via the power line 3 (see FIG. 1). The third bus bar 13 is maintained at an earth potential via the power cord 3.

In addition, the first bus bar 11 includes a plurality of first contacts 11a to receive the second plug blades 9 of plugs 7.

On the other hand, the second bus bar 12 includes nipping pieces 12a arranged at constant intervals in an extending direction of the second bus bar 12.

Each of the nipping pieces 12a nips a branch bar 17 and a pair of second contacts 17a are provided at an end portion of the branch bar 17.

The second contacts 17a are paired with the foregoing first contacts 11a, and receive the first plug blades 8 of the plugs 7.

Then, the third bus bar 13 includes a plurality of third contacts 13a to receive the earth terminals 10 of the plugs 7.

A first circuit board 20 is provided under the branch bars 17.

The first circuit board 20 is provided with current meters 30 each configured to measure an electric current being supplied from the branch bar 17 to the corresponding plug 7.

Figure 3:
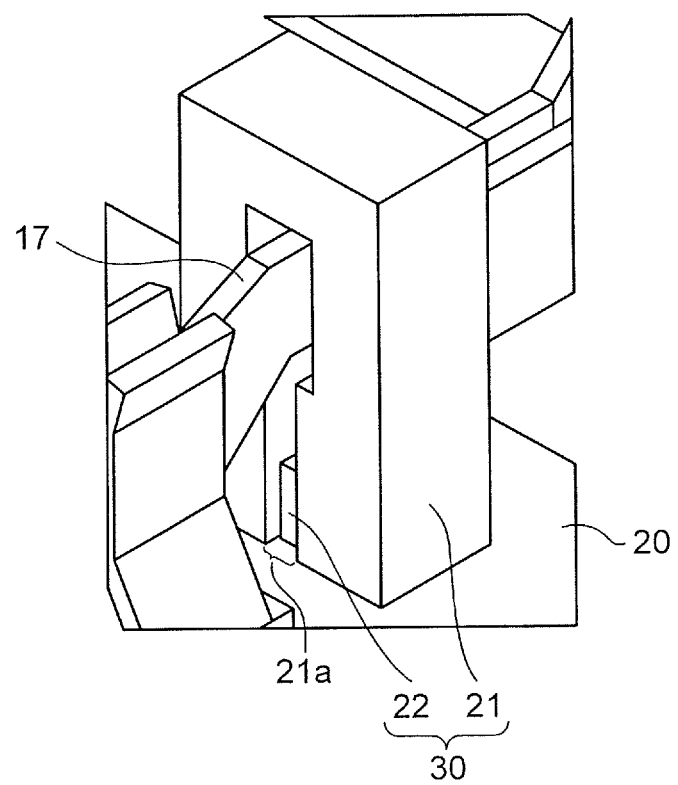
FIG. 3 is an enlarged perspective view of a current meter included in the power strip according to the first embodiment and the vicinity thereof.

FIG. 3 is an enlarged perspective view of the current meter 30 and the vicinity thereof.

The current meter 30 includes a magnetic core 21 fixedly attached to the first circuit board 20 corresponding to each of the branch bars 17. The magnetic core 21 is formed to confine therein a magnetic field generated around the current flowing through the branch bar 17, and is formed in an almost ring shape along the flux of the magnetic field. A material for the magnetic core 21 is not particularly limited, and easily available ferrites are used in this embodiment.

Moreover, the current meter 30 includes a hall element 22 in a gap 21a of the magnetic core 21. The hall element 22 is used to measure instantaneous values I(t) of the current flowing through the branch bar 17 on the basis of the intensity of the magnetic field in the gap 21a, and is mounted on the first circuit board 20 by soldering or the like.

Since the current meter 30 may be fabricated by attaching the magnetic core 21 and the hall element 22 to the first circuit board 20 as described above, it is possible to suppress increases in the number of components and assembling costs for the power strip 1.

Figure 4:
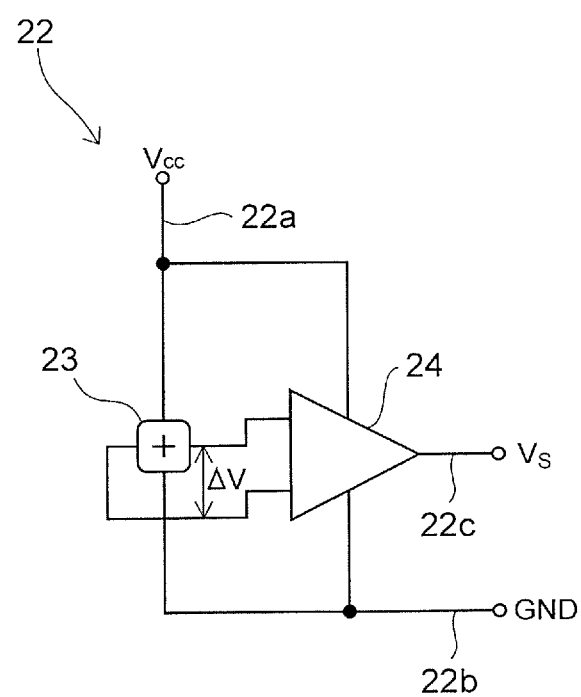
FIG. 4 is a circuit diagram of a hall element included in the power strip according to the first embodiment.

FIG. 4 is a circuit diagram of the hall element 22.

As illustrated in FIG. 4, the hall element 22 includes a gallium arsenide-based magnetic sensing unit 23 and a differential amplifier 24.

When the magnetic sensing unit 23 is exposed to a magnetic field with a voltage Vcc applied to a portion between a power supply terminal 22a and an earth terminal 22b, the magnetic sensing unit 23 generates a potential difference $\Delta V$ depending on the intensity of the magnetic field. The potential difference $\Delta V$ is amplified by the differential amplifier 24, and then is outputted as a current measurement signal $V_s$ from an output terminal 22c to the outside.

Figure 5:
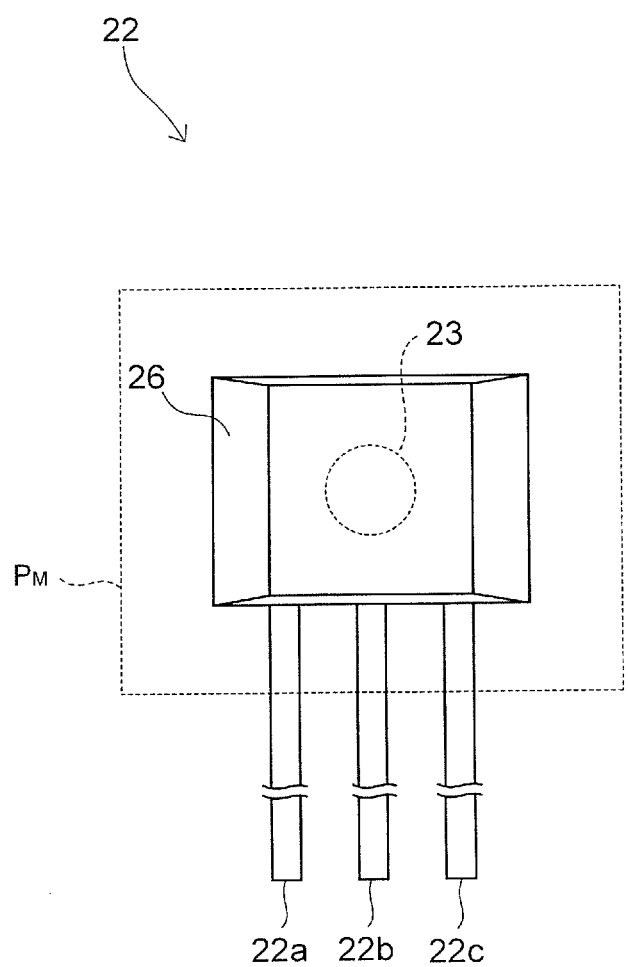
FIG. 5 is a plan view of the hall element included in the power strip according to the first embodiment.

FIG. 5 is a plan view of the hall element 22.

As illustrated in FIG. 5, the magnetic sensing unit 23 is sealed by a resin 26 so as to be located within a magnetic sensing plane $P_M$. The hall element 22 detects a magnetic-field component perpendicular to the magnetic sensing plane $P_M$ from the magnetic field passing through the magnetic sensing unit 23 and outputs the current measurement signal $V_s$ corresponding to the intensity of the component from the aforementioned output terminal 22c.

The terminals 22a to 22c are electrically connected to wirings inside the first circuit board 20 (see FIG. 3) by soldering or the like.

The forgoing hall element 22 is smaller in element size than other magnetic field measurement elements such as a current transformer, and is unlikely to lead to a size increase of a power strip.

Moreover, the current transformer measures the intensity of a magnetic field by using an induced current generated along with a change of the magnetic field over time, and therefore the measurement target of the current transformer is limited to an alternating magnetic field. In contrast, the hall element 22 has an advantage in that it measures the magnitude of a static magnetic field.

In addition, the hall element 22 is less expensive than the current transformer, and thereby prevents the costs for the power strip from becoming high.

Figure 6:
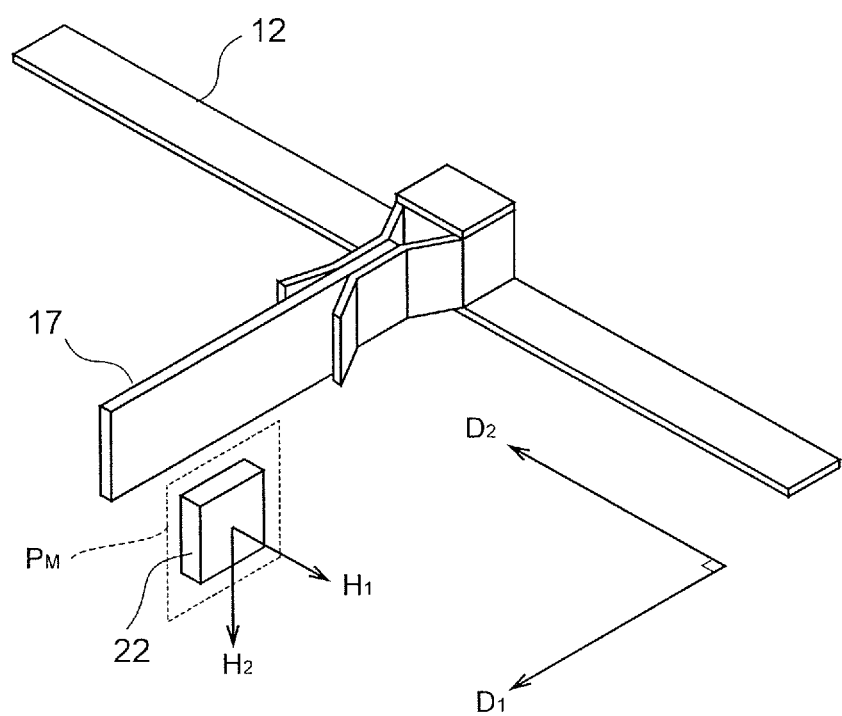
FIG. 6 is a perspective view for explaining a positional relationship between the magnetic sensing plane of the hall element and a branch bar according to the first embodiment.

FIG. 6 is a perspective view for explaining a positional relationship between the magnetic sensing plane $P_M$ of the hall element 22 and the branch bar 17.

The magnetic sensing plane $P_M$ is set in parallel with an extending direction $D_1$ of the branch bar 17. With this setting, a magnetic field $H_1$ generated from the current passing through the branch bar 17 passes through the magnetic sensing plane $P_M$ at substantially right angles, and thereby the current detection sensitivity of the hall element 22 is enhanced.

In addition, in this embodiment, the extending direction $D_1$ of the branch bar 17 is set in non-parallel with an extending direction $D_2$ of the second bus bar 12, and thereby a magnetic field $H_2$ generated in the second bus bar 12 does not pass through the magnetic sensing plane $P_M$ at right angles. Thus, it is possible to lower a risk that the hall element 22 provided to measure the magnetic field $H_1$ generated in the branch bar 17 may erroneously detect the magnetic field $H_2$ generated in the second bus bar 12. This prevents crosstalk in which the magnetic field detection result of the hall element 22 contains influence of a magnetic field other than $H_1$ and improves the measurement accuracy of the magnetic field $H_1$ by the hall element 22.

When the extending direction $D_1$ of the branch bar 17 is set to be perpendicular to the extending direction $D_2$ of the second bus bar 12 in particular, the magnetic sensing plane $P_M$ is also perpendicular to the extending direction $D_2$. For this reason, the magnetic field $H_2$ generated in the second bus bar 12 does not have a magnetic-field component perpendicular to the magnetic sensing plane $P_M$, and thereby the risk that the hall element 22 may erroneously detect the magnetic field $H_2$ may be further reduced.

Figure 7:
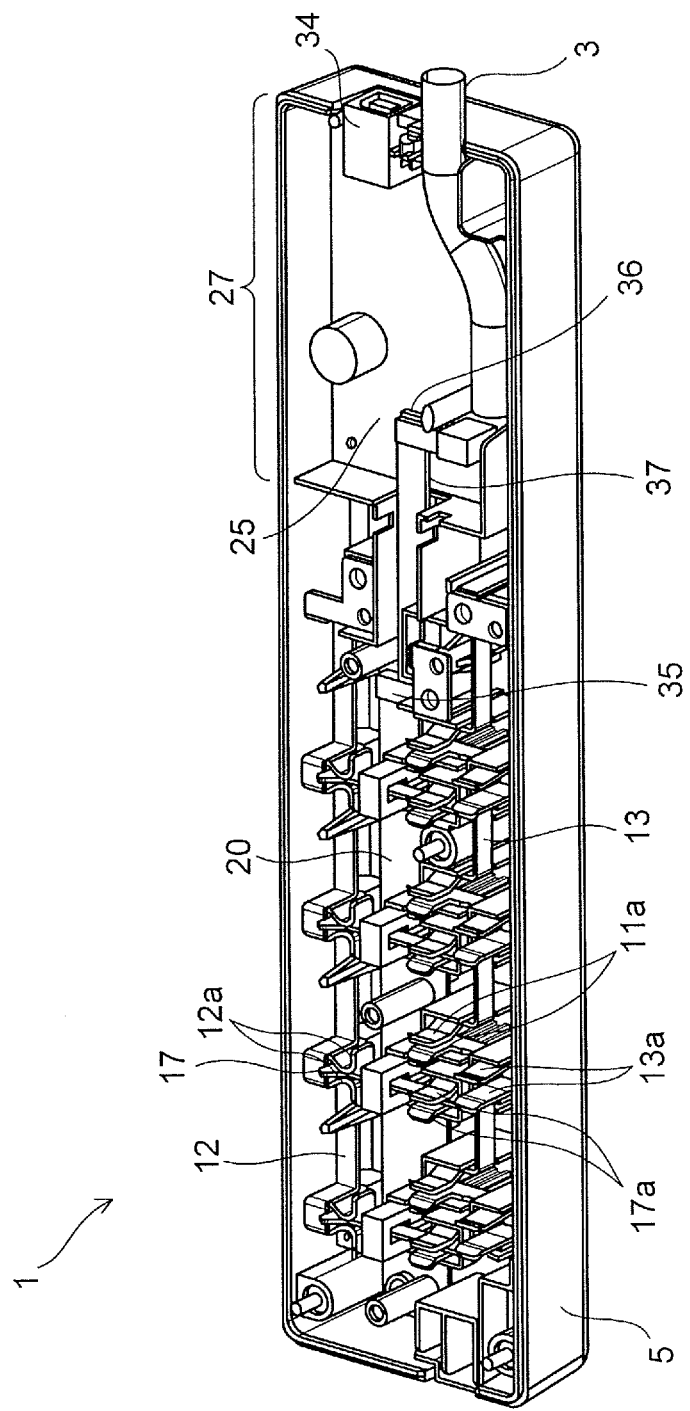
FIG. 7 is an external view of the power strip according to the first embodiment with its upper casing removed.

FIG. 7 is an external view of the power strip 1 with the upper casing 6 removed.

As illustrated in FIG. 7, the lower casing 5 is partitioned to have a transmitter circuit section 27 in which a second circuit board 25 is housed.

The first circuit board 20 and the second circuit board 25 are provided with connectors 35, 36, respectively, and a communication cable 37 is connected to these connectors 35, 36.

The communication cable 37 has functions such as: supplying the first circuit board 20 with electric power taken in from the power cord 3 and to drive the hall elements 22 (see FIG. 3); and transmitting an output signal of each of the hall elements 22 to the second circuit board 25.

Figure 8:
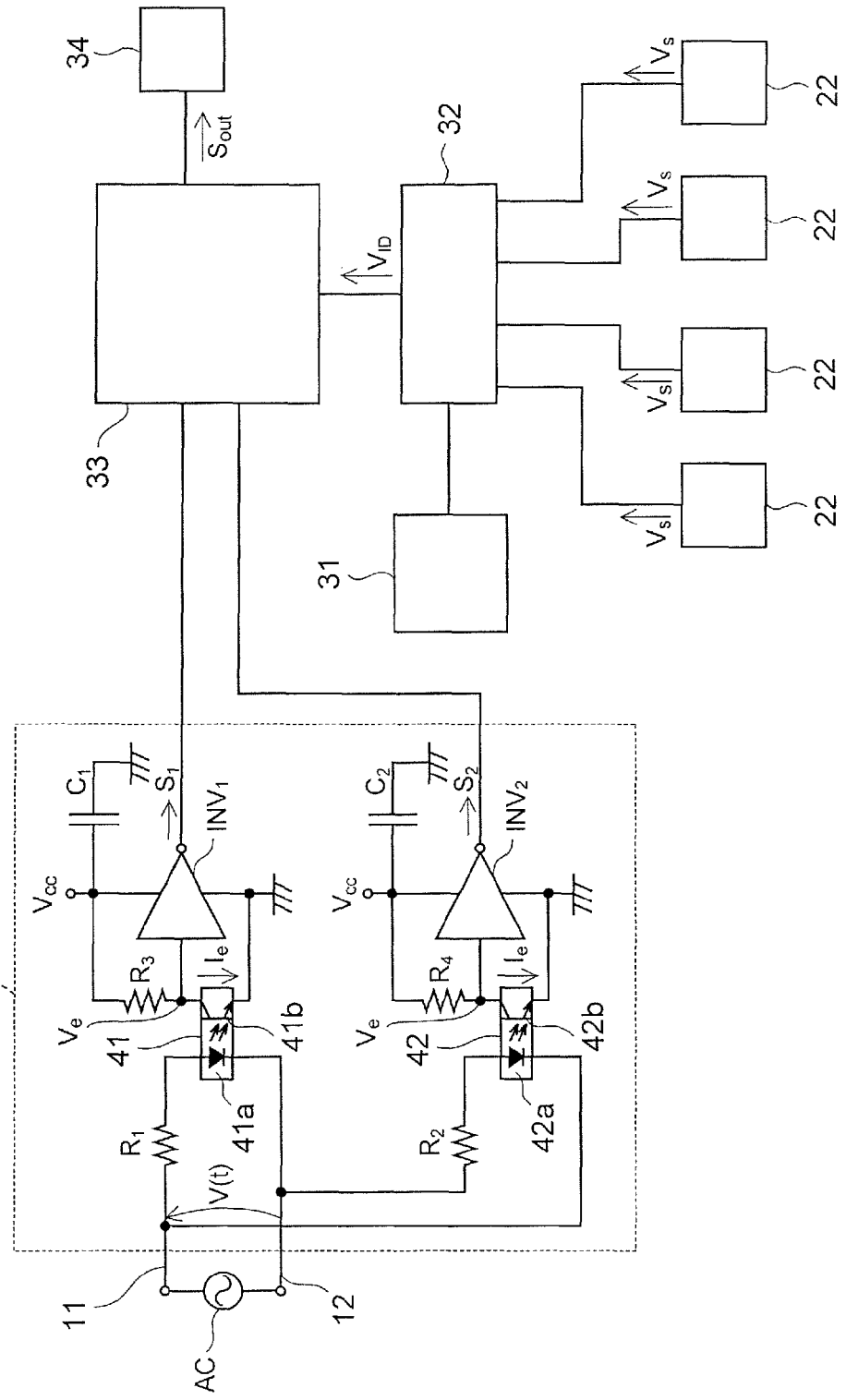
FIG. 8 is a functional block diagram of a transmitter circuit section included in the power strip according to the first embodiment.

FIG. 8 is a functional block diagram of the transmitter circuit section 27.

As illustrated in FIG. 8, the transmitter circuit section 27 includes a storage unit 31, an AD convertor 32, a computing unit 33, an output port 34 and a voltage measuring unit 50.

Among them, the AD convertor 32 generates a digital current signal $V_{1D}$ by digitizing the current measurement signal $V_s$ with analog values outputted from each of the hall elements 22, and then outputs the digital current signal $V_{1D}$ to the computing unit 33.

The computing unit 33 is, for example, an MPU (Micro Processing Unit), and calculates power consumption values of the respective jack portions 1a (see FIG. 1) as described later. The calculation result is outputted as output data $S_{out}$ from the computing unit 33 and then is outputted to the outside via the output port 34 electrically connected to the computing unit 33.

Then, the voltage measuring unit 50 includes a first photocoupler 41, a second photocoupler 42, a first inverter $INV_1$, and a second inverter $INV_2$.

Among them, the first photocoupler 41 includes a first light emitting diode 41a and a first photo transistor 41b to receive light from the first light emitting diode 41a. A cathode of the first light emitting diode 41a is electrically connected to the second bus bar 12. An anode of the first light emitting diode 41a is electrically connected to the first bus bar 11 via a first resistor $R_1$.

The first resistor $R_1$ functions to prevent an excessive current from flowing into the first light emitting diode 41a from each of the bus bars 11, 12.

A voltage Vcc is applied to an emitter of the first photo transistor 41b via a third resistor $R_3$, and a collector of the first photo transistor 41b is maintained at an earth voltage.

An emitter current $I_e$ flows between the emitter and the collector. An amount of voltage drop at the third resistor $R_3$ varies depending on the magnitude of the emitter current $I_e$, and accordingly the emitter voltage $V_e$ varies.

For example, when the first photocoupler 41 is in the OFF state, the first photo transistor 41b is in the OFF state. Thus, the emitter current $I_e$ does not flow into the third resistor $R_3$ and the emitter voltage $V_e$ becomes at the high level that is the same as the voltage Vcc.

On the other hand, when the first photocoupler 41 is in the ON state, the first phototransistor 41b is in the ON state. Thus, the emitter current $I_e$ flows into the third resistor $R_3$, and the emitter voltage $V_e$ becomes lower than the voltage Vcc by the amount of voltage drop at the third resistor $R_3$, and thereby becomes at the low level.

The emitter voltage $V_e$ thus varying is turned into a first output signal $S_1$ by inverting the voltage level of the emitter voltage $V_e$ at the first inverter $INV_1$ in the following stage.

Here, the first photocoupler 41 is set to become in the ON state when a forward voltage applied to the first light emitting diode 41a exceeds a positive first threshold $V_1$. For this reason, whether or not an instantaneous value V(t) of the power supply voltage between the bus bars 11, 12 exceeds the first threshold $V_1$ may be judged by monitoring the voltage level of the first output signal $S_1$.

Here, the first inverter $INV_1$ drives between the voltage Vcc and the earth potential. One of electrodes of a first capacitor $C_1$ is connected to an input node of the voltage Vcc, and thereby the voltage Vcc inputted to the first inverter $INV_1$ is stabilized.

On the other hand, the second photocoupler 42 includes a second light emitting diode 42a and a second photo transistor 42b to receive light from the second light emitting diode 42a. A cathode of the second light emitting diode 42a is electrically connected to the first bus bar 11. An anode of the second light emitting diode 42a is electrically connected to the second bus bar 12 via a second resistor $R_2$.

The second photocoupler 42 and the second inverter $INV_2$ at the following stage have functions similar to the foregoing functions of the first photocoupler 41 and the first inverter $INV_1$.

For example, when the second photocoupler 42 is in the OFF state, the emitter voltage $V_e$ becomes at the high level as in the voltage Vcc, and a voltage at the low level obtained by inverting the emitter voltage $V_e$ is outputted as a second output signal $S_2$ from a second inverter $INV_2$.

On the other hand, when the second photocoupler 42 is in the ON state, the emitter voltage $V_e$ becomes lower than the voltage Vcc due to a voltage drop at a fourth resistor $R_4$, and thereby the second output signal $S_2$ becomes at the high level.

Here, in the second inverter $INV_2$, the voltage Vcc is stabilized by a second capacitor $C_2$ provided to an input node of the voltage Vcc. In addition, a second resistor $R_2$ is provided at the previous stage of the second photocoupler 42, whereby an excessive current may be prevented from flowing into the second light emitting diode 42a from the bus bars 11, 12.

The foregoing second photocoupler 42 is set to become in the ON state when a forward voltage applied to the second light emitting diode 42a exceeds a positive second threshold $V_2$. For this reason, whether or not an instantaneous value V(t) of the power supply voltage between the bus bars 11, 12 exceeds the second threshold $V_2$ may be judged by monitoring the voltage level of the second output signal $S_2$.

Figure 9:
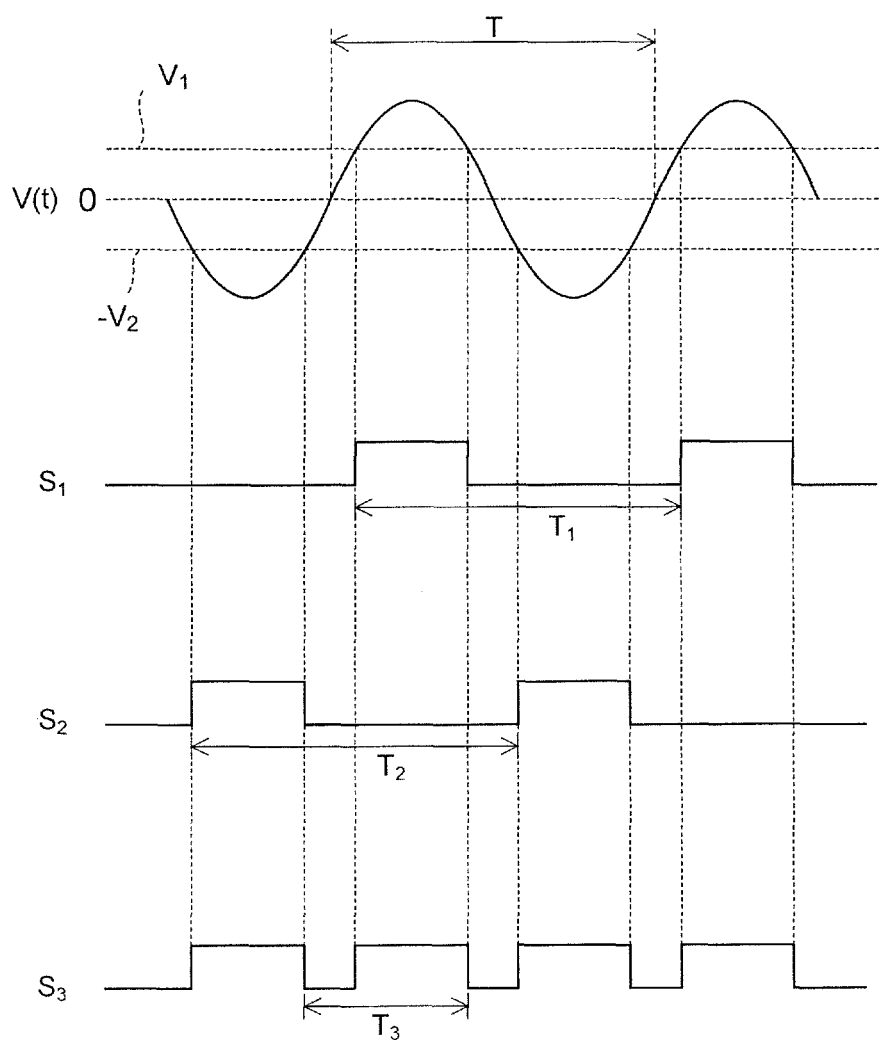
FIG. 9 is a timing chart of a first output signal, a second output signal, and instantaneous values of a power supply voltage according to the first embodiment.

FIG. 9 is a timing chart of the first output signal $S_1$, the second output signal $S_2$, and the instantaneous values V(t) of the power supply voltage described above. Here, FIG. 9 also presents a composite signal $S_3$ obtained by synthesizing the first output signal $S_1$ and the second output signal $S_2$.

In addition, the power supply voltage V(t) is defined as 0 when the potentials of the first bus bar 11 and the second bus bar 12 are equal to each other, and as positive when the potential of the first bus bar 11 is higher than that of the second bus bar 12.

As illustrated in FIG. 9, the first output signal $S_1$ is at the high level while the instantaneous values V(t) of the power supply voltage exceed the first threshold $V_1$.

On the other hand, the second output signal $S_2$ is at the high level while the instantaneous values V(t) are lower than the second threshold $V_2$.

Meanwhile, the composite signal $S_3$ obtained by synthesizing these signals $S_1$, $S_2$ is at the low level while both signals $S_1$, $S_2$ are at the low level.

The computing unit 33 recognizes, as a cycle T of the power supply voltage, any one of a cycle $T_1$ of the first output signal $S_1$ and a cycle $T_2$ of the second output signal $S_2$. Instead, the computing unit 33 may recognize a double of a cycle $T_3$ of the composite signal $S_3$ as the cycle T.

Figure 10:
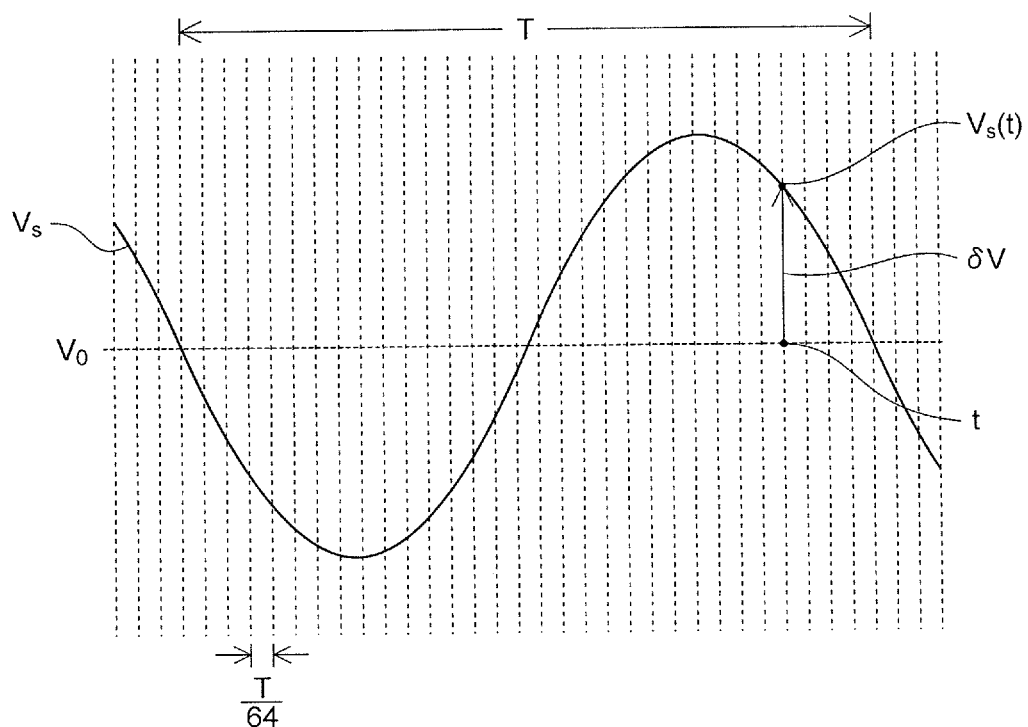
FIG. 10 is a timing chart illustrating a current sampling method in the power strip according to the first embodiment.

FIG. 10 is a timing chart illustrating a current sampling method in the power strip 1.

The computing unit 33 performs current sampling for a current flowing through each of the plurality of branch bars 17 individually (see FIG. 2).

A plurality of dotted lines in FIG. 10 represent time points of sampling points. The value of the current measurement signal $V_s$ at each of the sampling points is sampled by the computing unit 33.

The sampling frequency F is not particularly limited. In this embodiment, the aforementioned cycle T is evenly divided by 64, and 64/T is employed as the sampling frequency F.

The current measurement signal $V_s$ takes a default value $V_0$ of about 2.5V even when a current I does not flow in the branch bar 17 (see FIG. 3). When the current I flows through the branch bar 17, the value of the current measurement signal $V_s$ increases or decreases from the default value $V_0$. Whether the current measurement signal $V_s$ increases or decreases in comparison with the default value $V_0$ depends on the direction of the current I flowing through the branch bar 17.

As described above, the default value $V_0$ is a value taken by the current measurement signal $V_s$ when the current I does not flow in the branch bar 17, and has significance as a zero point of the current measurement signal $V_s$.

The computing unit 33 calculates the instantaneous value I(t) of the current flowing through the branch bar 17 at a time point t on the basis of a difference $\delta V$ between the current measurement signal $V_s(t)$ at the time point t and the default value $V_0$.

Figure 11:
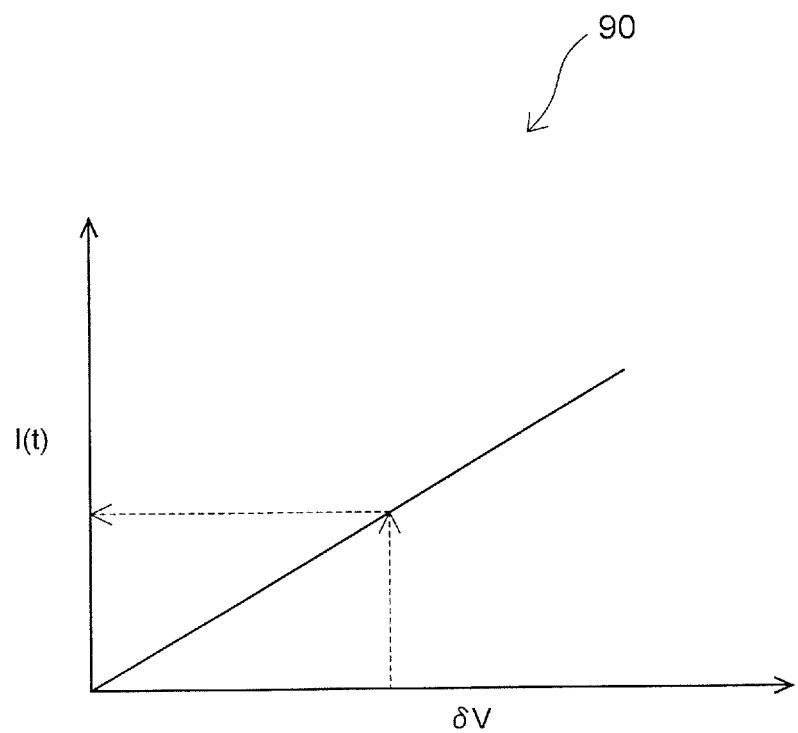
FIG. 11 is a schematic diagram of a table used to calculate the instantaneous values of a current in the first embodiment.

FIG. 11 is a schematic diagram of a table 90 used to calculate the instantaneous value I(t).

This table 90 is formed by making a correspondence between the difference $\delta V$ and the instantaneous value I(t), and is stored in advance in the storage unit 31. The computing unit 33 calculates the instantaneous value I(t) corresponding to the difference $\delta V$ at the time point t by referring to this table 90.

However, when the default value $V_0$ is used as the zero point of the current measurement signal $V_s$ as described above, the following inconvenience occurs.

Figure 12:
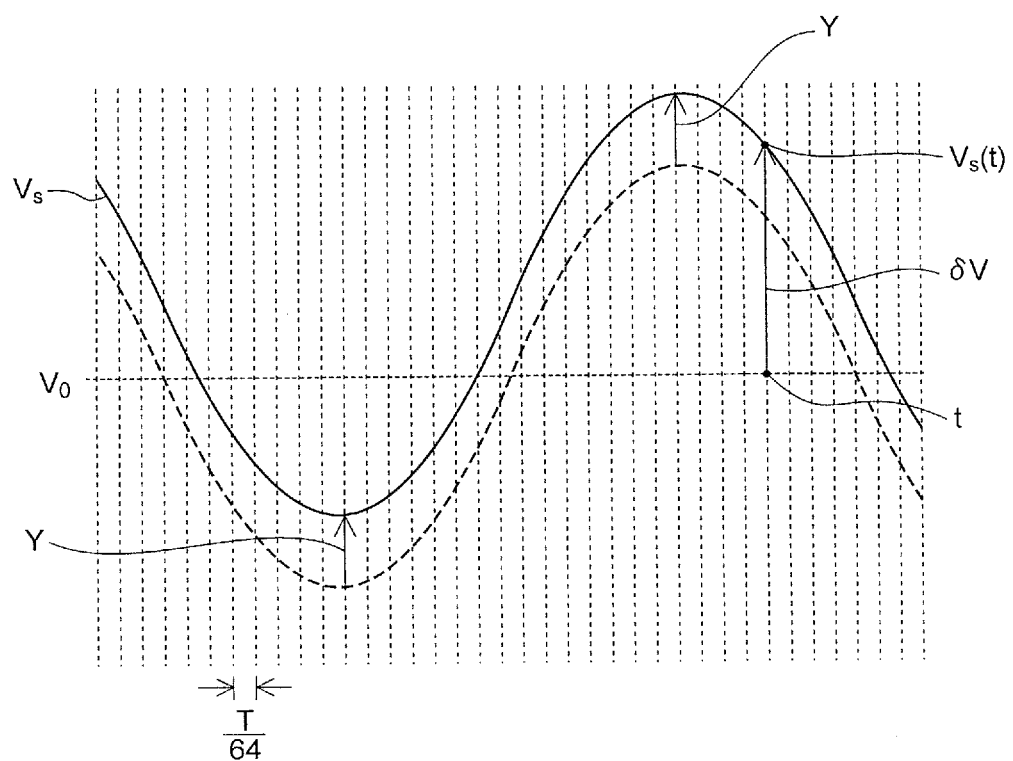
FIG. 12 is a timing chart for explaining an inconvenience occurring when a default value is used as a zero point for current measurement.

FIG. 12 is a timing chart for explaining the inconvenience.

An example in FIG. 12 illustrates a case where the value of the current measurement signal $V_s(t)$ at each time point is shifted by Y from its proper value (dotted line) in comparison with the case in FIG. 10. Such shift occurs, for example, when the hall element 22 is exposed to the magnetic field generated from a current flowing through a next bus bar 17.

Meanwhile, the default value $V_0$ is a value taken by the current measurement signal $V_s$ when the current I is not flowing, and therefore is a fixed value specific to each hall element 22. For this reason, even thought the current measurement signal $V_s(t)$ is shifted, the default value $V_0$ does not vary.

Hence, when the current measurement signal $V_s(t)$ is shifted as described above, the difference $\delta V$ between the current measurement signal $V_s(t)$ and the default value $V_0$ deviates from the proper value, and the calculation result of the instantaneous value I(t) of the current calculated based on the difference $\delta V$ becomes inaccurate.

Figure 13:
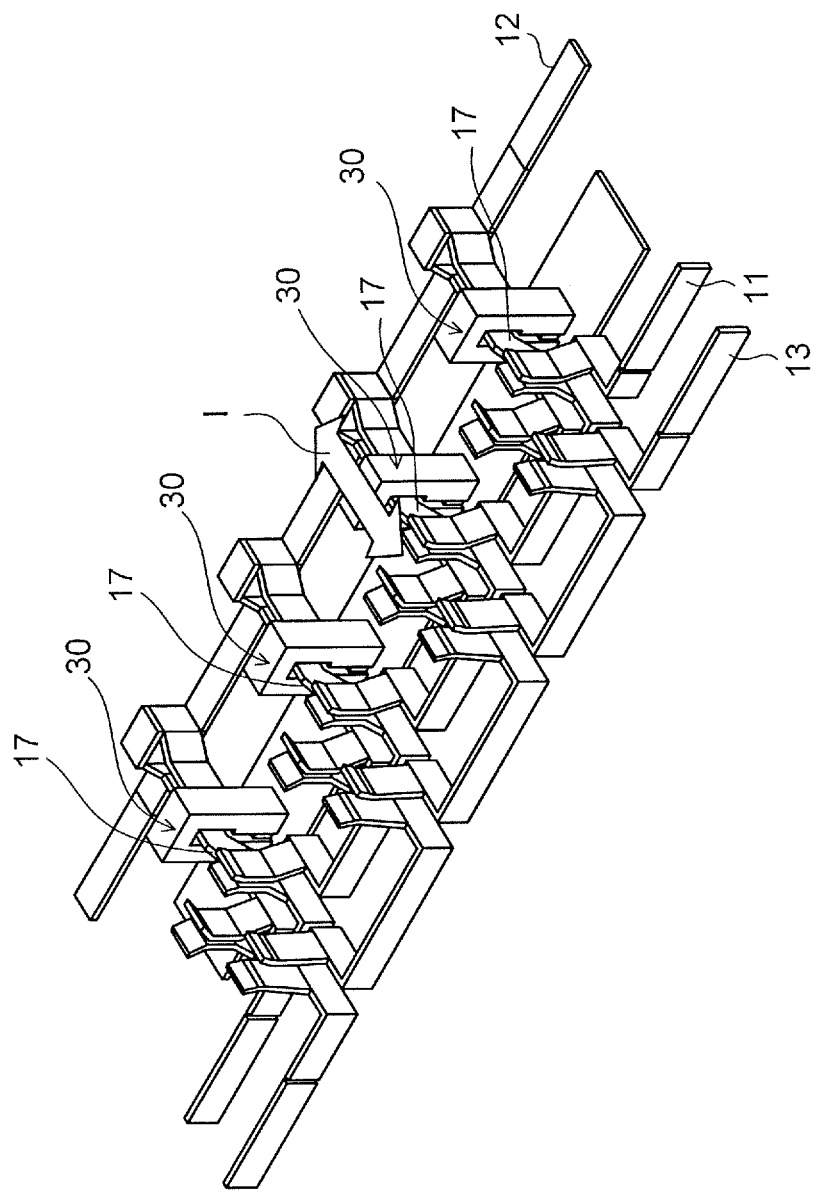
FIG. 13 is a perspective view illustrating one of factors causing a shift of a current measurement signal.

The shift of the current measurement signal $V_s$ occurs due to various factors. FIG. 13 is a perspective view illustrating one of the factors.

FIG. 13 illustrates a case where a current I flows through the second branch bar 17 from the right-hand side, and no currents I flow in the other branch bars 17.

In this case, the magnetic field generated by the current I is measured by a plurality of current meters 30. Thus, the current meter 30 of a branch bar 17 where no current I flows picks up the above magnetic field, and consequently the current measurement signal $V_s$ of the current meter 30 is shifted.

Such a phenomenon is notable when one of the jack portions 1a (see FIG. 1) is connected to a load larger than those of the other jack portions 1a.

To solve such inconvenience, there is a method of measuring the instantaneous value I(t) in the following way.

Figure 14:
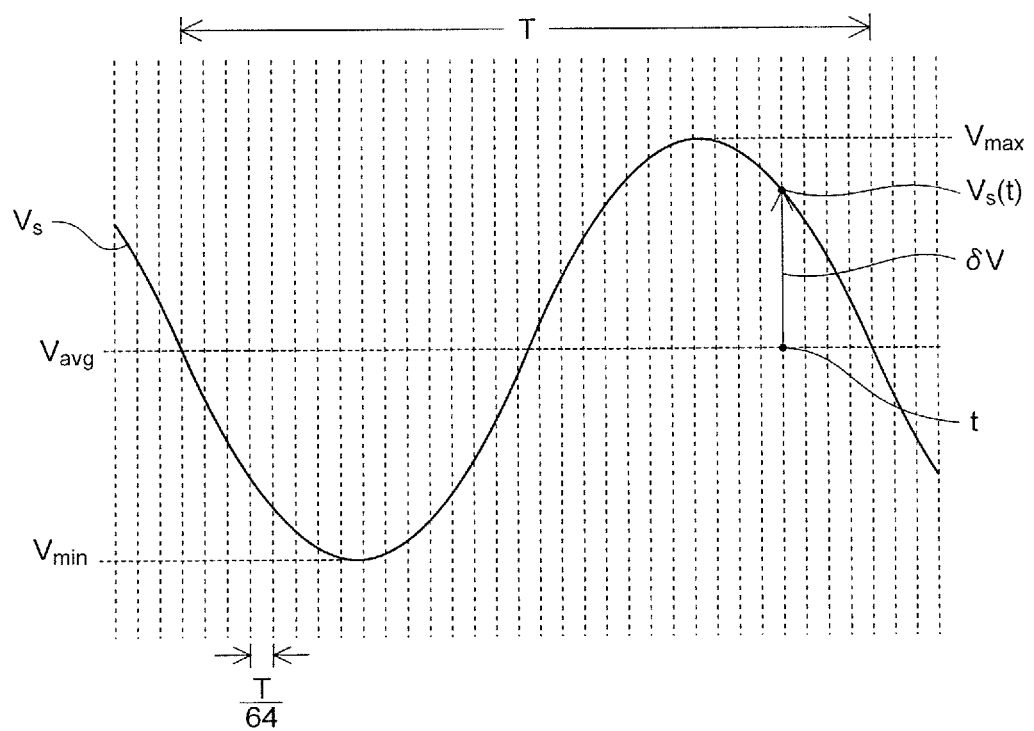
FIG. 14 is a timing chart for explaining a method of measuring the instantaneous values of a current without using the default value.

FIG. 14 is a timing chart for explaining a method of measuring the instantaneous values I(t) without using the aforementioned default value $V_0$.

A plurality of dotted lines in FIG. 14 represent time points of sampling points as in FIG. 10. Then, the value of the current measurement signal $V_s$ at each sampling point is sampled by the computing unit 33.

The sampling frequency F is 64/T, which is the same as in the case of FIG. 10.

After completion of the sampling, the computing unit 33 obtains the maximum value $V_{max}$ and the minimum value $V_{min}$ of the current measurement signal $V_s$ in the cycle T.

Then, the computing unit 33 calculates the middle point $V_{avg}$ between the maximum value $V_{max}$ and the minimum value $V_{min}$. Here, the middle point $V_{avg}$ is calculated by $V_{avg} = (V_{max}+V_{min})/2$ If the waveform of the current measurement signal $V_s$ is a sine wave, the middle point $V_{avg}$ is located at the point of inflexion of the sine wave, and has significance as the zero point of the current measurement signal $V_s$.

Hence, the computing unit 33 calculates the instantaneous value I(t) of the current flowing through the branch bar 17 at a time point t on the basis of the difference $\delta V$ (=$V_s(t)-V_{avg}$) between the current measurement signal $V_s(t)$ at the time point t and the middle point $V_{avg}$. This calculation is done by the computing unit 33 in reference to the table 90 described in FIG. 11.

The method of calculating the instantaneous value I(t) described above does not use the default value $V_0$. Accordingly, even when the waveform of the current measurement signal $V_s$ is shifted due to the magnetic field, the difference $\delta V$ does not deviates, so that the calculation result of the instantaneous value I(t) does not become inaccurate.

However, this method also has an inconvenience described below.

Figure 15:
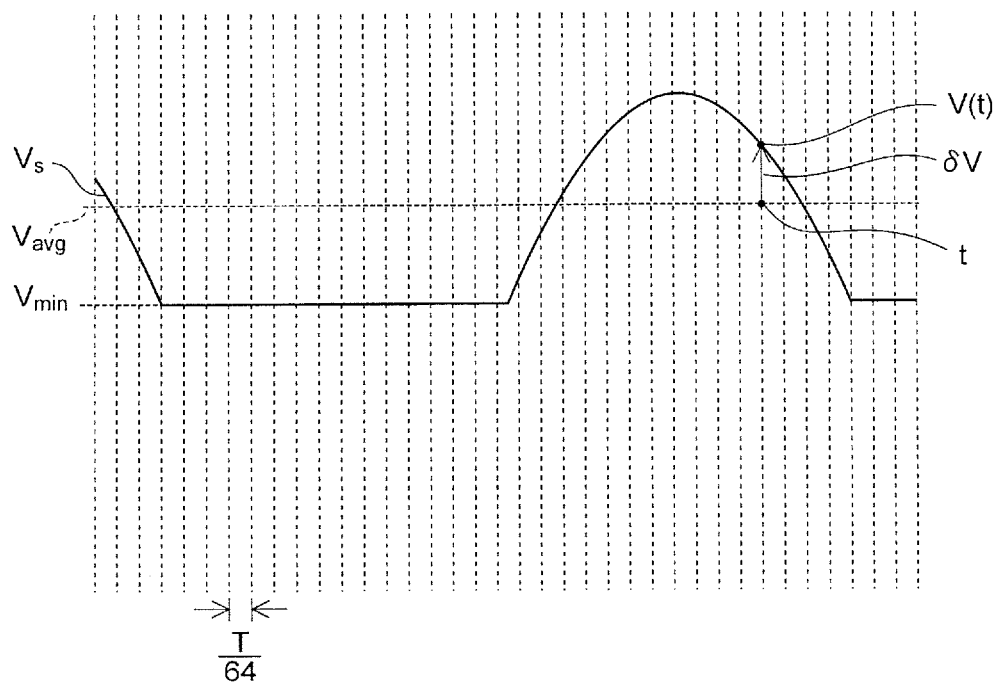
FIG. 15 is a timing chart for explaining an inconvenience occurring when a middle point of the current measurement signal is used as the zero point for current measurement.

FIG. 15 is a timing chart for explaining the inconvenience.

In an example of FIG. 15, an upper half waveform of the current measurement signal $V_s$ appears. Such a waveform appears when the current is half-wave rectified in an electrical device connected to the jack portion 1a (see FIG. 1).

In the case of such a waveform, the proper zero point of the current measurement signal $V_s$ is the minimum value $V_{min}$ of the current measurement signal $V_s$, but the middle point $V_{avg}$ ($=(V_{max}+V_{min})/2$) takes a value deviating from the minimum value $V_{min}$.

For this reason, even when the difference $\delta v$ ($=v_s(t)-V_{avg}$) is calculated with respect to the middle point $V_{avg}$ and the instantaneous value I(t) corresponding to the difference $\delta V$ is calculated by using the table 90 (see FIG. 11), the calculation result is inaccurate.

Note that, besides the half-wave rectification, full-wave rectification of a current also makes the calculation result of the instantaneous value I(t) inaccurate for the same reason as that described above.

Figure 16:
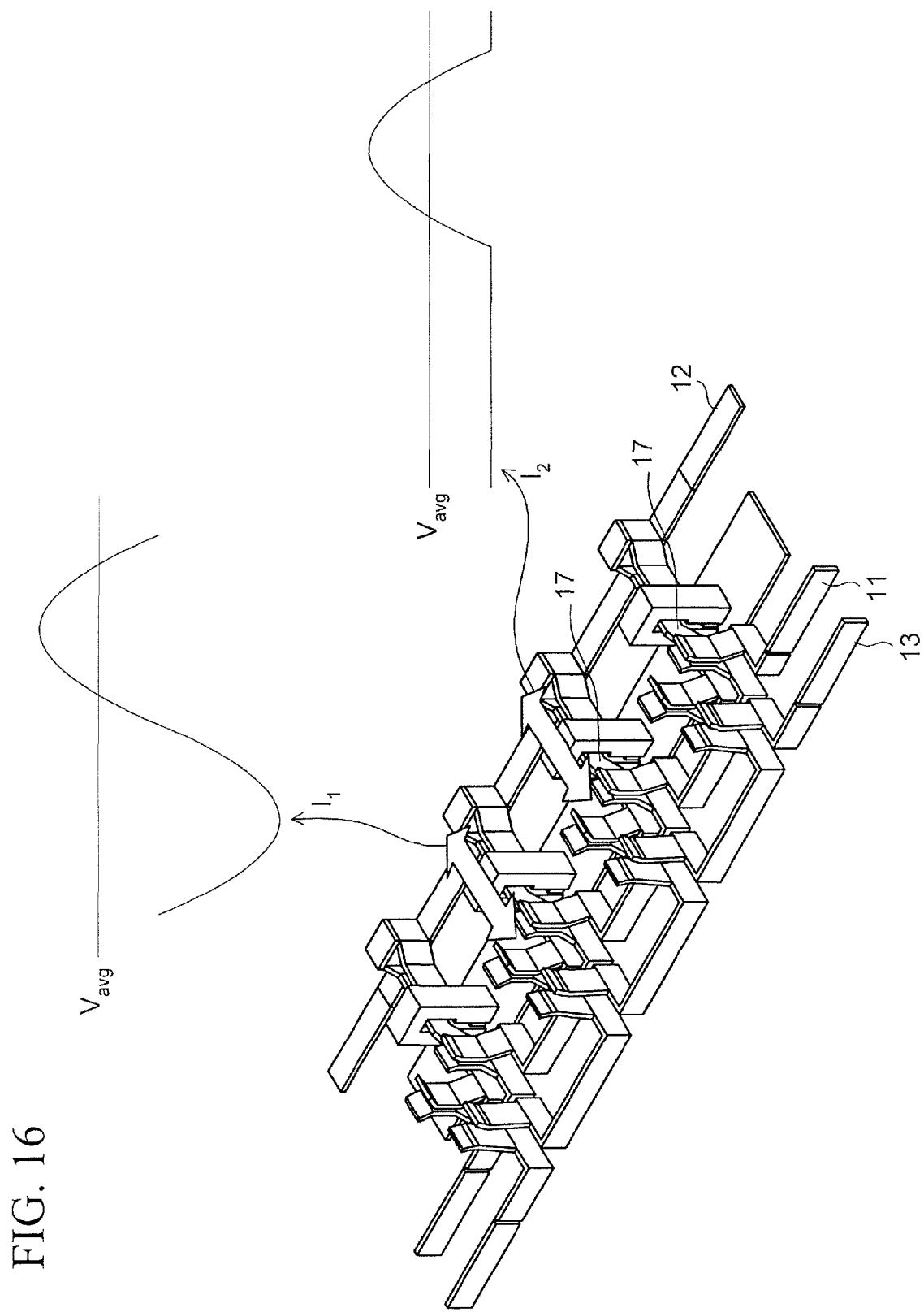
FIG. 16 is a schematic diagram for explaining another inconvenience occurring when the middle point of the current measurement signal is used as the zero point for current measurement.

FIG. 16 is a schematic diagram for explaining another inconvenience that occurs due to the above situation.

An example of FIG. 16 illustrates a case where a current $I_1$ flowing through one of the branch bars 17 is in a sine wave and a current $I_2$ flowing through another branch bar 17 is half-wave rectified.

In this case, if the middle point $V_{avg}$ of the current measurement signal $V_s$ of the half-wave rectified current $I_2$ is set as the zero point common to all the jack portions 1a, the instantaneous values are inaccurately calculated not only for the current $I_2$ but also for the full-wave rectified current $I_1$.

In consideration of these inconveniences, this embodiment measures the instantaneous value of the current in the following way.

Figure 17:
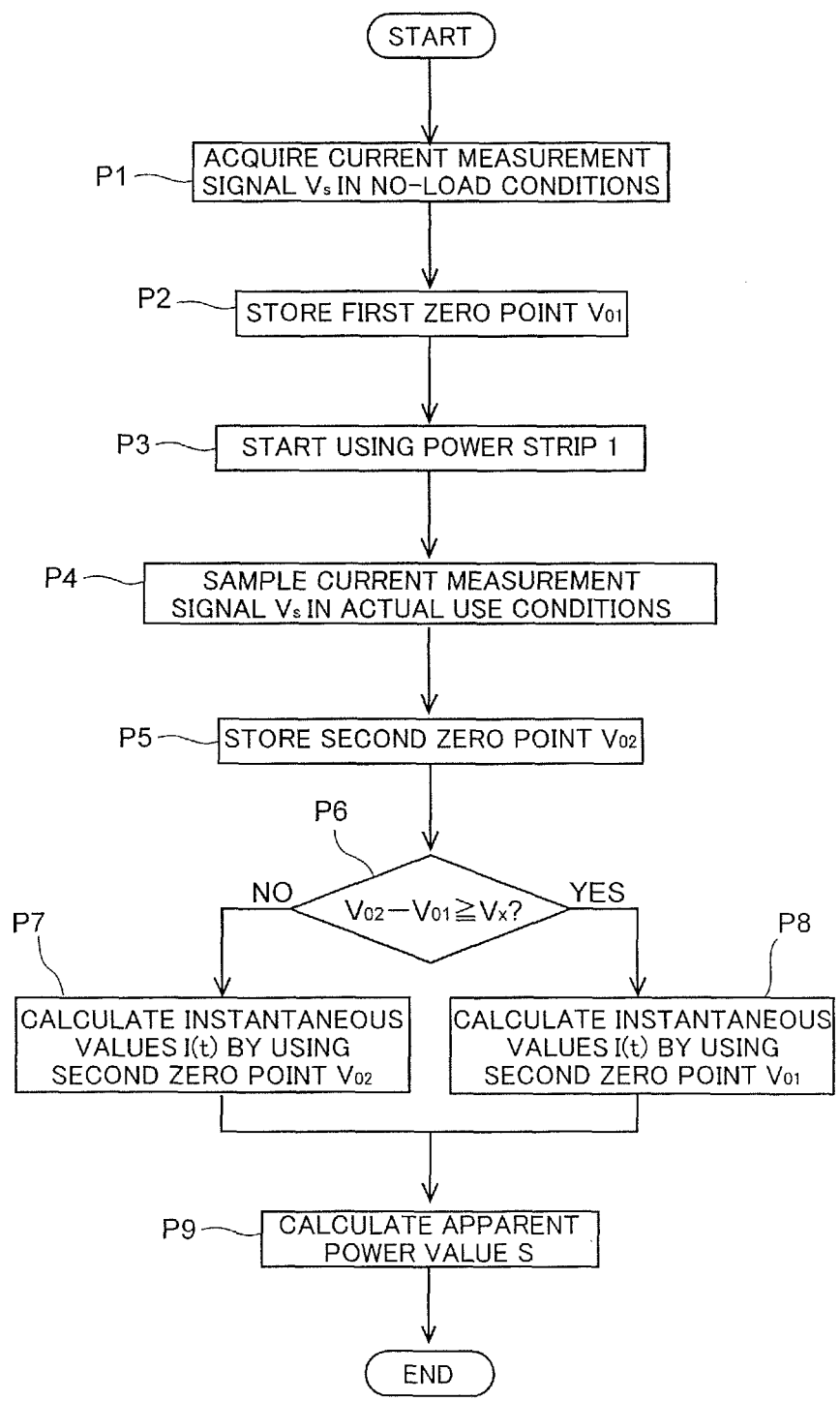
FIG. 17 is a flowchart illustrating a power measurement method according to the first embodiment.

FIG. 17 is a flowchart illustrating a power measurement method according to this embodiment.

In first step P1, the computing unit 33 acquires current measurement signals $V_s$ outputted from the hall elements 22 with none of the jack portions 1a connected to loads. The current measurement signal $V_s$ is acquired individually from each of the plurality of hall elements 22.

Then, the method proceeds to step P2, and the computing unit 33 stores each of the measured values of the current measurement signals $V_s$ measured in step P1, as a first zero point $V_{01}$ in the storage unit 31. The first zero point $V_{01}$ is stored in the storage unit 31 in association with each of the hall elements 22.

The first zero point $V_{01}$ measured under no load as described above is a fixed value specific to each of the jack portions 1a.

Note that the timing to perform step P1 and step P2 is not particularly limited, but it is preferable to perform these steps in a factory before shipping of the power strip 1.

Next, the method proceeds to step P3, and a user starts using the power strip 1. For use of the power strip 1, the plug 2 (see FIG. 1) is inserted into a wall outlet not illustrated and external electrical devices are connected to the respective jack portions 1a.

Then, the method proceeds to step P4. In this step, the computing unit 33 samples the current measurement signal $V_s$ for each of the plurality of jack portions 1a as described in FIG. 10. The current measurement signal $V_s$ has significance as measured values of the current I flowing through each branch bar 17. For this reason, this step is equivalent to acquisition of measured values, at a plurality of time points, of a current supplied from each of the plurality of jack portions 1a to an external electrical device.

Next, the method proceeds to step P5, and the computing unit 33 obtains the maximum value $V_{max}$ and the minimum value $V_{min}$ in the cycle T from among the values of the current measurement signal $V_s$ sampled in step P4. Moreover, the computing unit 33 calculates the middle point $V_{avg}$ between the maximum value $V_{max}$ and the minimum value $V_{min}$, and stores the middle point $V_{avg}$ as a second zero point $V_{02}$ in the storage unit 31

This step is performed by the computing unit 33 for each of the jack portions 1a. Then, the calculation result of the second zero point $V_{02}$ is stored in the storage unit 31 for each of the jack portions 1a.

In addition, unlike the first zero point $V_{01}$ which is a fixed value, the second zero point $V_{02}$ calculated using the current measurement signal $V_s$ in actual use conditions as described above takes a value depending on an electrical device connected to each of the jack portions 1a.

When a current is half-wave rectified in an electrical device as described in reference to FIG. 15, in particular, the second zero point $V_{02}$ takes a value largely different from the first zero point $V_{01}$, and the calculation of the instantaneous value I(t) using the second zero point $V_{02}$ provides an inaccurate calculation result.

Hence, the level of a difference between the zero points $V_{01}$, $V_{02}$ is an indication of whether or not the instantaneous value I(t) may be calculated by using the second zero point $V_{02}$.

For this reason, in next step P6, the computing unit 33 judges if the difference between the first zero point $V_{01}$ and the second zero point $V_{02}$ ($V_{02}-V_{01}$) is equal to or larger than a reference value $V_x$.

The value of the reference value $V_x$ is not particularly limited, but it is preferable to set the reference value $V_x$ to such a value that a case where the waveform of a current is a sine wave (see FIG. 14) and a case where the waveform of is a half wave (see FIG. 15) may be distinguished from each other.

For example, for a sinusoidal current having a minimum value of −10 mA and a maximum value of 10 mA, it is assumed that the difference between the maximum value $V_{max}$ and the minimum value $V_{min}$ of the current measurement signal $V_s$ is 1 mV.

In this case, for a half-wave current having a minimum value of 0 mA and a maximum value of 10 mA, the difference between the maximum value $V_{max}$ and the minimum value $V_{min}$ of the current measurement signal $V_s$ is 0.5 mV, which is half of 1 mV described above. Thus, the middle point $V_{avg}$ between the maximum value $V_{max}$ and the minimum value $V_{min}$ is a value larger by 0.25 mV ($=0.5$ mV/2) than 2.5V, which is the default value $V_0$. Then, if the reference value $V_x$ is set to 2.5V+0.25 mV, the waveform of the current may be roughly judged as a half wave when the difference ($V_{02}-V_{01}$) is equal to or larger than the reference value $V_x$ or as a sine wave when the difference ($V_{02}-V_{31}$) is smaller than the reference value $V_x$.

Note that the setting method of the reference value $V_x$ is not limited to this, and the reference value $V_x$ may be set appropriately depending on the properties of the hall element 22.

Then, when the difference ($V_{02}-V_{01}$) is judged as smaller than the reference value $V_x$ (NO) in this step P6, the method proceeds to step P7.

In this case, the first zero point $V_{01}$ and the second zero point $V_{02}$ are not largely different. For this reason, it is considered that the current is not half-wave rectified in an external electrical device and therefore the waveform of the current is close to a sine wave. Thus, even if the instantaneous value I(t) of the current I is calculated by using the second zero point $V_{02}$, the calculation result is not inaccurate.

Accordingly, in step P7, the computing unit 33 calculates the instantaneous values I(t) of the current I for each jack portion 1a by using the second zero point $V_{02}$.

For example, the computing unit 33 calculates the instantaneous value I(t) of the current flowing through the branch bar 17 at a time point t on the basis of the difference $\delta V$ (=$V_s(t) - V_{02}$) between the current measurement signal $V_s(t)$ at the time point t and the second zero point $V_{02}$. This calculation is done by the computing unit 33 reading the instantaneous value I(t) corresponding to the difference by as described in reference to FIG. 11.

Since the second zero point $V_{02}$ is obtained from the current measurement signal $V_s$ in the actual use conditions, the value thereof reflects influence of a surrounding magnetic field as is the case with the current measurement signal $V_s$. Thus, the influence of the surrounding magnetic field is cancelled out in the difference $\delta V$ (=$V_s(t) - V_{02}$), which prevents the surrounding magnetic field from lowering the calculation accuracy of the instantaneous value I(t).

On the other hand, when the difference ($V_{02} - V_{01}$) is judged as equal to or larger than the reference value $V_x$ (YES) in step P6, the method proceeds to step P8.

When the difference ($V_{02} - V_{01}$) is large as described above, there is a possibility that the current may be half-wave rectified in an external device as illustrated in FIG. 15. In this case, if the instantaneous value I(t) of the current is calculated by using the second zero point $V_{02}$ which is the middle point between the maximum value $V_{max}$ and the minimum value $V_{min}$, the calculation accuracy is lowered.

For this reason, in step P8, the computing unit 33 calculates the instantaneous values I(t) of the current I by using the first zero point $V_{01}$.

For example, the computing unit 33 calculates the instantaneous value I(t) of the current flowing through the branch bar 17 at a time point t on the basis of the difference $\delta V$ (=$V_s(t) - V_{01}$) between the current measurement signal $V_s(t)$ at the time point t and the first zero point $V_{01}$. This calculation is done by the computing unit 33 reading the instantaneous value I(t) corresponding to the difference $\delta v$ as described in reference to FIG. 11.

When the first zero point $V_{01}$ is used as the reference as described above, the instantaneous values I(t) may be accurately obtained even for a current having asymmetric upper and lower halves, such as a half-wave rectified current.

When the above step P7 or P8 is completed, the method proceeds to step P9.

In step P9, the power value for each of the plurality of jack portions 1a is calculated individually in the following way using the instantaneous values I(t) calculated in any of step P7 and step P8.

Firstly, the computing unit 33 calculates an effective value $I_{rms}$ of the current I on the basis of the following formula (1):

[Formula 1]

$$I_{rms} = \sqrt{\frac{1}{T} \int_0^T I(t)^2 dt}. \quad (1)$$

Note that, as the method of calculating the effective value $I_{rms}$, there is another method using a peak value $I_{max}$ of the current I in the cycle T. In this case, the effective value $I_{rms}$ is calculated from $I_{rms} = I_{max}/\sqrt{2}$. Although this calculation method is effective in a case where the waveform of a current is a sine wave, the calculation of the effective value $I_{rms}$ may be inaccurate in a case where the waveform of a current is different from a sine wave.

Hence, in order to accurately calculate the effective value $I_{rms}$ irrespective of the waveform of a current, it is preferable to use the root mean square of the instantaneous values I(t) over the cycle T as the effective value $I_{rms}$, as in the above formula (1).

It should be noted that the effective value $I_{rms}$ is calculated for each of the plurality of jack portions 1a.

Moreover, by use of the effective value $I_{rms}$, the computing unit 33 calculates an apparent power value S for each of the jack portions 1a from the following formula (2):

[Formula 2]

$$S = V_{rms} \cdot I_{rms} \quad (2).$$

In the formula (2), $V_{rms}$ is a known effective value of a power supply voltage, and $V_{rms}$ is 100V in Japan.

Here, the effective value $V_{rms}$ of the power supply voltage sometimes varies from 100V depending on load conditions. In this case, a value $V_{rms}$ which reflects the load conditions may be estimated based on the output signals $S_1$ to $S_3$ as in a third embodiment to be described later.

By the steps described hereinabove, the apparent power values S of consumption by the plurality of electronic devices connected to the respective jack portions are calculated.

The apparent power values S are included in the output data $S_{out}$ (see FIG. 8) and are outputted from the computing unit 33 to the output port 34.

According to the present embodiment described above, the instantaneous values I(t) of the current are calculated by using any one of the first zero point $V_{01}$ and the second zero point $V_{02}$ depending on the waveform of the current as in steps P7, P8 in FIG. 17, the accuracy of the calculation of the instantaneous values I(t) may be increased regardless of the waveform of a current.

Thus, the apparent power values S obtained from the instantaneous values I(t) may be calculated precisely, and thereby the power consumption at each jack portion 1a may be calculated accurately.

Since the second zero point $V_{02}$ is obtained from the current measurement signal $V_s$ in the actual use conditions, in particular, the value thereof reflects influence of a surrounding magnetic field. For this reason, the calculation of the instantaneous values I(t) using the second zero point $V_{02}$ may prevent accuracy reduction of the calculation of the instantaneous values I(t) due to the surrounding magnetic field.

In contrast, if the instantaneous values I(t) are inaccurately calculated by using the second zero point $V_{02}$ as in the case of a half-wave rectified current, the accuracy of the calculation of the instantaneous values I(t) may be maintained by using the first zero point $V_{01}$ which is the fixed value independent of the current.

Second Embodiment

In this embodiment, description is provided for a power measurement system using the power strip described in the first embodiment.

Figure 18:
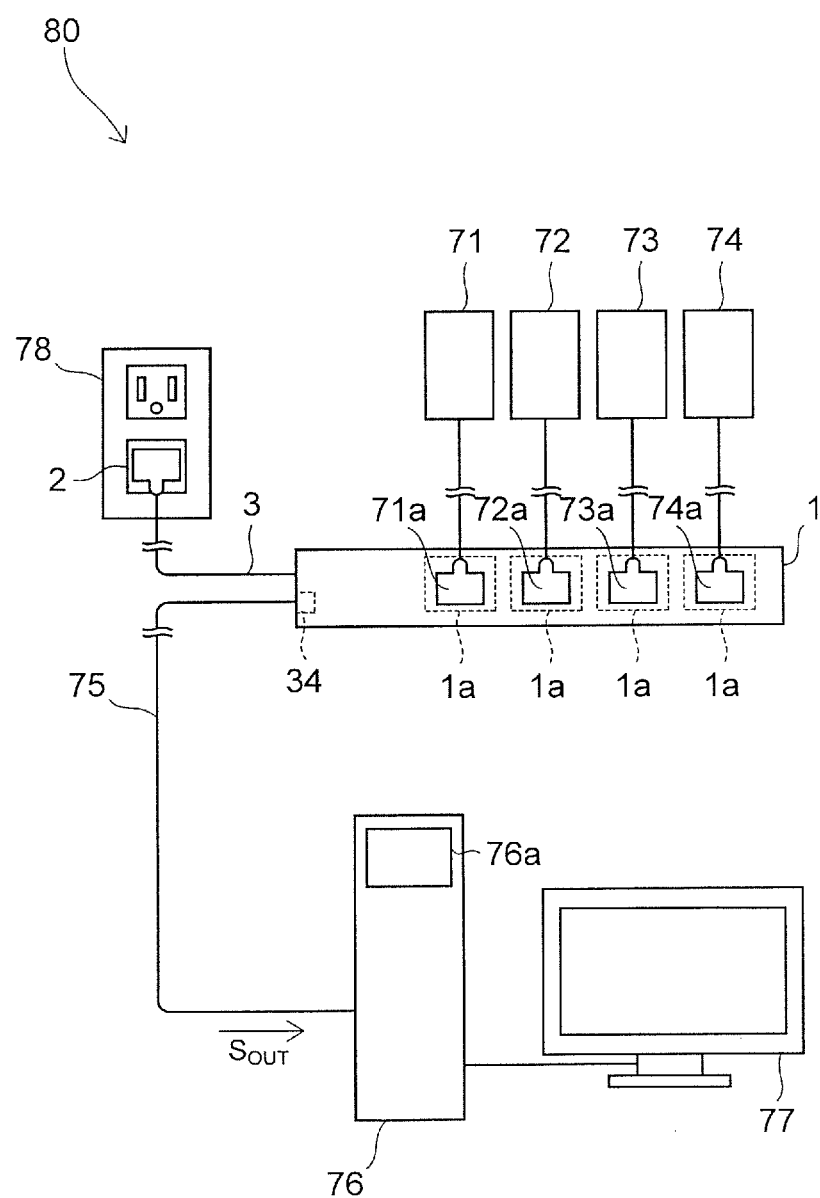
FIG. 18 is a schematic diagram for explaining a power measurement system according to a second embodiment.

FIG. 18 is a schematic diagram for explaining a power measurement system 80 according to this embodiment.

In order to use the power strip 1, the plug 2 is inserted into a wall outlet 78 as illustrated in FIG. 18.

Then, first to fourth plugs 71a to 74a of electrical devices 71 to 74 are inserted into the jack portions 1a of the power strip 1. Here, all the jack portions 1a do not have to be connected to the electrical devices, but some of the jack portions 1a may be unused.

In addition, an electronic computer 76 such as a personal computer and the output port 34 of the power strip 1 are connected together by a signal cable 75 such as a USB cable.

With this connection, the apparent power values S of the respective electrical devices 71 to 74 are imported to the electronic computer 76 via the aforementioned output data $S_{out}$. The apparent power value S is displayed on a monitor 77 for each of the electrical devices 71 to 74.

By monitoring the monitor 77, a user may recognize in real time how much electric power is consumed in each of the electrical devices 71 to 74, and thereby may acquire information for deciding whether to reduce power consumption for each of the electrical devices 71 to 74 for energy saving.

For the sake of convenience of users, the instantaneous values I(t) of the current supplied from each of the jack portions 1a, or the effective current value $I_{rms}$ thereof may be displayed on the monitor 77 by use of the output data $S_{out}$.

In addition, a database 76a may be provided in the electronic computer 76, and the total power consumption within a predetermined period by each of the electrical devices 71 to 74 may be stored in the database 76a. By use of this, the information for deciding whether to reduce power consumption may be further increased.

According to the embodiment described above, the power value of each of the electrical devices 71 to 74 connected to the power strip 1 may be individually monitored in the foregoing manner, which meets the needs for energy saving.

Although the embodiments have been described in detail hereinabove, the embodiments are not limited to the above ones. For example, although the computing unit 33 (see FIG. 8) of the power strip 1 performs all the steps in the flowchart in FIG. 17 in the first embodiment, the electronic computer 76 may execute these steps.

Third Embodiment

In the first embodiment, the known value (100V) is used as the effective value $V_{rms}$ of the power supply voltage to calculate the apparent power value S based on the formula (2).

However, the actual effective value $V_{rms}$ sometimes varies from the known value depending on conditions of an electrical device connected to each of the jack portions 1a (see FIG. 1).

To address this, in this embodiment, the actual effective value $V_{rms}$ is estimated in the following way.

Figure 19:
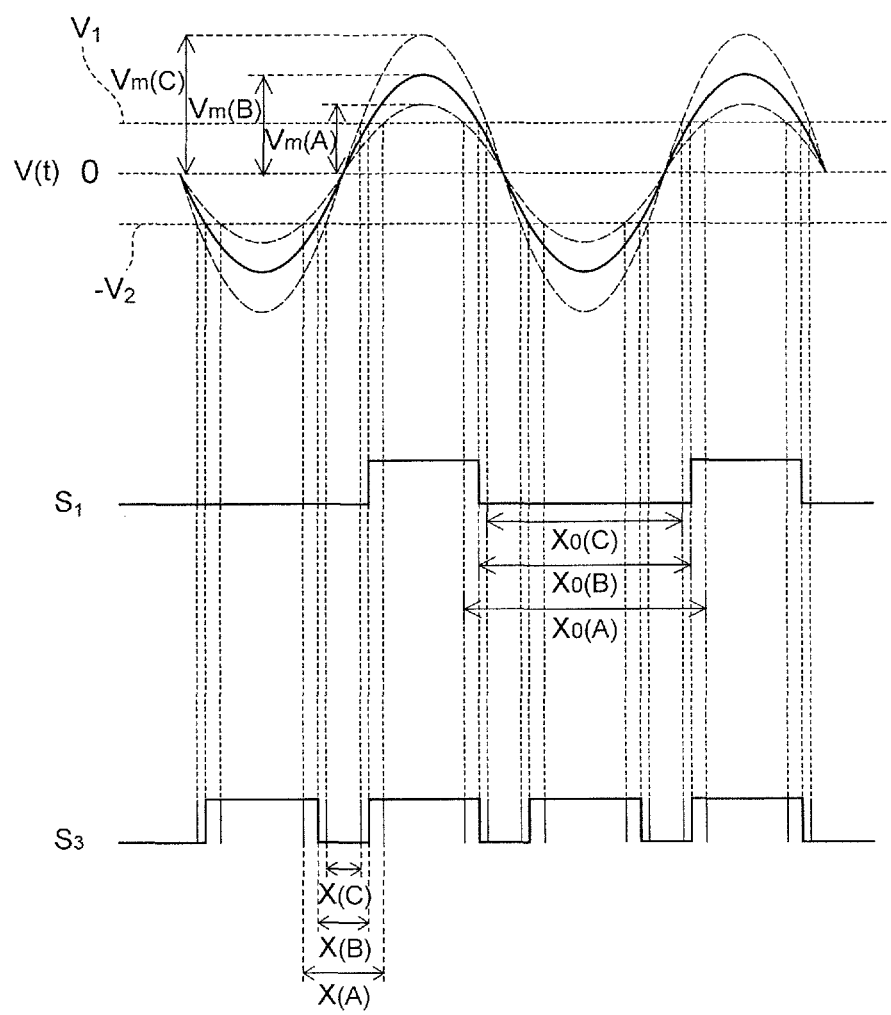
FIG. 19 is a timing chart of instantaneous values V of a power supply voltage and a composite signal in actual use conditions of a power strip according to a third embodiment.

FIG. 19 is a timing chart of the instantaneous values V(t) of the power supply voltage and the composite signal $S_3$ in the actual use conditions of the power strip 1.

In FIG. 19, the same elements as those described in the first embodiment are given the same reference numerals, and the description thereof is omitted below.

As illustrated in FIG. 19, the peak value $V_m$ of the instantaneous values V(t) varies as represented by $V_m(A)$, $V_m(B)$, $V_m(c)$ due to a load of an external device connected to each of the jack portions 1a in the actual use conditions.

When the peak value varies, the timing at which the instantaneous value V(t) exceeds each of the thresholds $V_1$, $V_2$ varies and accordingly the length X of a period in which the composite signal $S_3$ is at the low level also varies as presented by X(A), X(B), X(C).

Thus, the above length X of the period may be used as an indication for estimating an effective value $V_{rms}$ of the power supply voltage.

In this embodiment, provided that the length X of the period and the effective value $V_{rms}$ of the power supply voltage have a linear relationship, the effective value $V_{rms}$ is estimated by using the following formula (3):

[Formula 3]

$$V_{rms}=aX+b \quad (3)$$

In the formula (3), a and b are constants experimentally determined in advance.

In the above formula (3), the length X of the period when the composite signal $S_3$ is at the low level is used to calculate the effective value $V_{rms}$, but this embodiment is not limited to this.

For example, as illustrated in FIG. 19, when the peak value $V_m$ varies, the length $X_0$ of a period when the first output signal $S_1$ is at the low level also varies as represented by $X_0(A)$, $X_0(B)$, $X_0(C)$. Hence, the length $X_0$ may be used to estimate the effective value $V_{rms}$.

In this case, provided that the length $X_0$ of the period and the effective value $V_{rms}$ of the power supply voltage have a linear relationship, the effective voltage value $V_{rms}$ may be estimated by using the following formula (4):

[Formula 4]

$$V_{rms}=\alpha X_0+\beta \quad (4).$$

In the formula (4), $\alpha$ and $\beta$ are constants experimentally determined in advance.

In this embodiment, in order to execute the flowchart in FIG. 17 described in the first embodiment, the computing unit 33 calculates the effective value $V_{rms}$ based on the formula (3) or the formula (4) in advance. Then, the effective value $V_{rms}$ thus calculated is used in step P9 (see FIG. 17), and the apparent power value S is calculated based on the formula (2) in the first embodiment.

According to the embodiment described above, the effective value $V_{rms}$ of the power supply voltage is estimated by using the formula (3) or the formula (4), and thereby the calculation result of the apparent power value S reflects a variation in the effective value $V_{rms}$ of the power supply voltage. Thus, the apparent power value S may be calculated more accurately than in the first embodiment.

Fourth Embodiment

In this embodiment, the computing unit 33 calculates instantaneous values V(t) of the power supply voltage in the following way, and uses them to calculate the power consumption for each jack portion 1a.

Firstly, after calculating the effective value $V_{rms}$ of the power supply voltage in accordance with the formula (3) in the third embodiment, the computing unit 33 calculates the instantaneous values V(t) of the power supply voltage based on the following formula (5):

[Formula 5]

$$V(t)=\sqrt{2}V_{rms}\sin(\omega t)=\sqrt{2}(aX+b)\sin(\omega t) \quad (5).$$

In the formula (5), $\omega$ is an angular frequency of the power supply voltage and a usable value thereof is a value determined in a region where the power strip 1 is used.

Instead, if the effective value $V_{rms}$ of the power supply voltage is calculated in accordance with the formula (4) in the third embodiment, the computing unit 33 may calculate the instantaneous values V(t) of the power supply voltage based on the following formula (6):

[Formula 6]

$$V(t) = \sqrt{2}V_{rms}\sin(\omega t) = \sqrt{2}(\alpha X + \beta)\sin(\omega t) \quad (6)$$

Then, the computing unit 33 calculates the effective power value P for each jack portion 1a based on the following formula (7) using the instantaneous values V(t) calculated from the formula (5) or the formula (6), and the instantaneous values I(t) of the current calculated in step P7 or step P8 (see FIG. 17) in the first embodiment:

[Formula 7]

$$P = \frac{1}{T}\int_0^T V(t)I(t)dt. \quad (7)$$

The aforementioned calculation of the effective power value P in addition to the apparent power value S may make a contribution to convenience of users.

Fifth Embodiment

Figure 20:
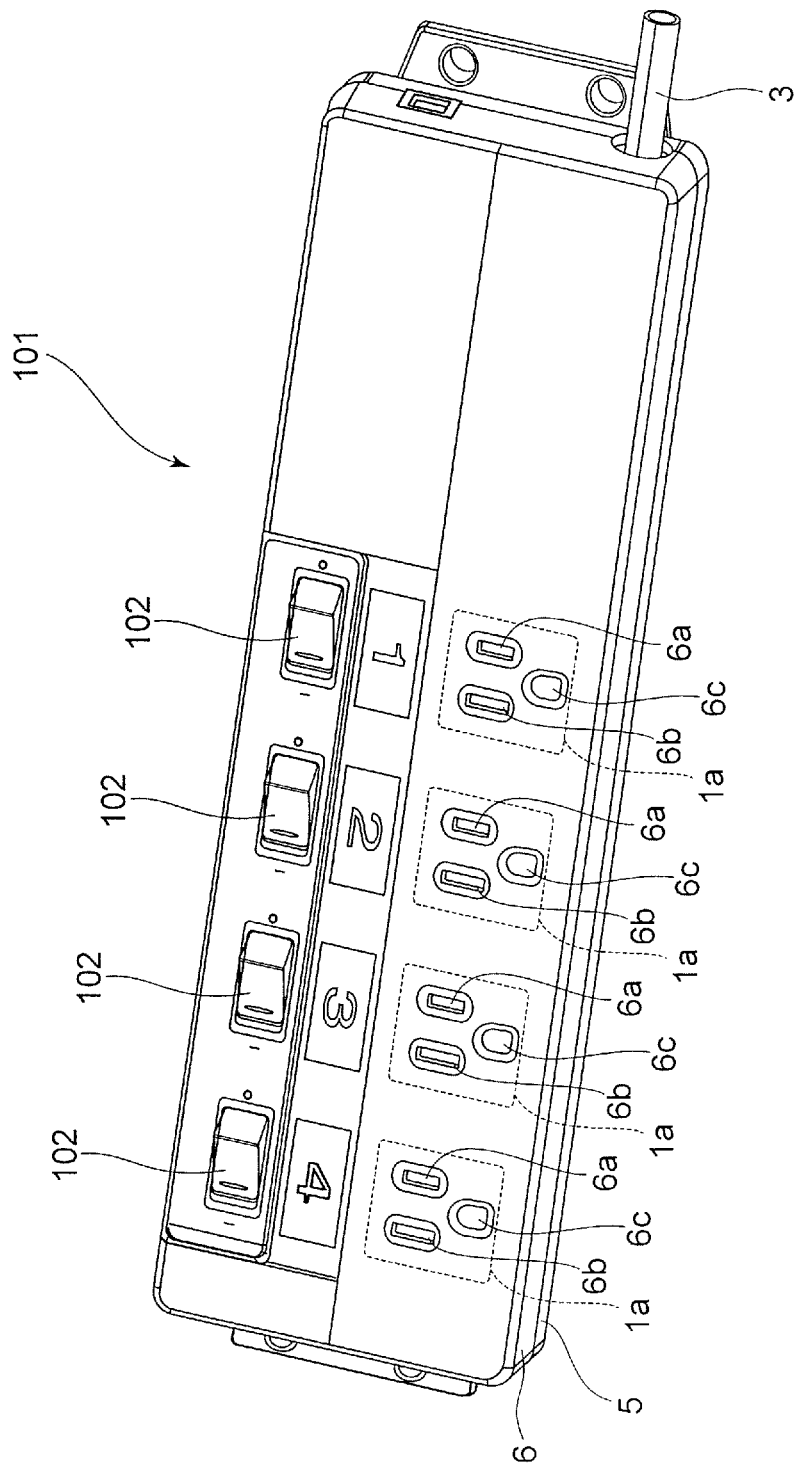
FIG. 20 is an external view of a power strip according to a fifth embodiment.

FIG. 20 is an external view of a power strip 101 according to this embodiment. In FIG. 20, elements having the same functions as those described in the first embodiment are given the same reference numerals as in the first embodiment, and the description thereof is omitted below.

As illustrated in FIG. 20, this power strip 101 is provided with switches 102 respectively corresponding to a plurality of jack portions 1a.

Figure 21:
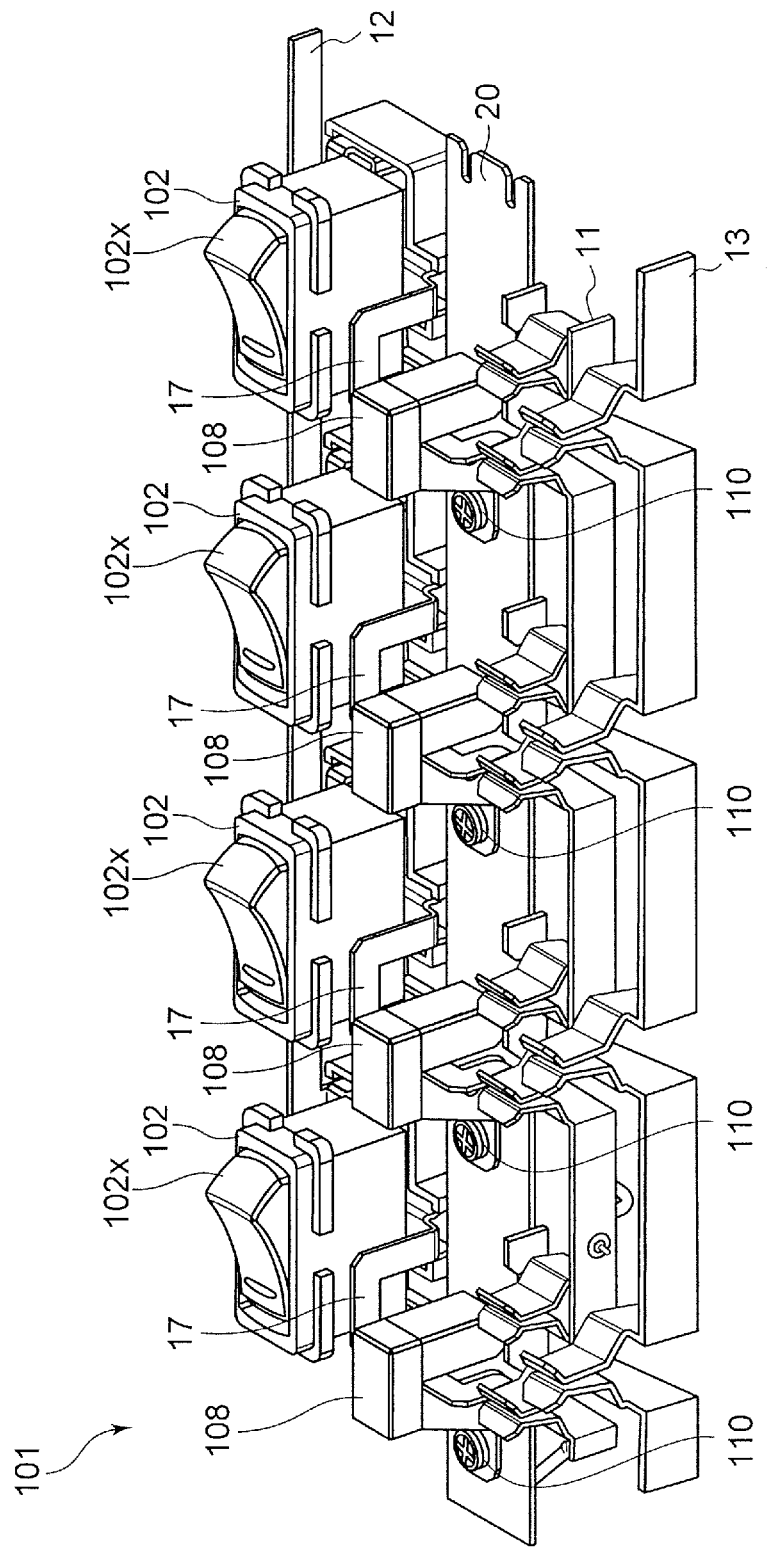
FIG. 21 is a perspective view of the power strip according to the fifth embodiment with its lower casing and upper casing removed.

FIG. 21 is a perspective view of the power strip 101 with a lower casing 5 and an upper casing 6 removed.

Each switch 102 is a rocker switch. When a user presses down a button 102x on an ON side or OFF side, the switch 102 electrically connect the corresponding branch bar 17 to a second bus bar 12 or electrically disconnect the branch bar 17 from the second bus bar 12.

Moreover, covers 108 for housing magnetic cores 21 (see FIG. 3) are fixed to a first circuit board 20 with screws 110.

Figure 22:
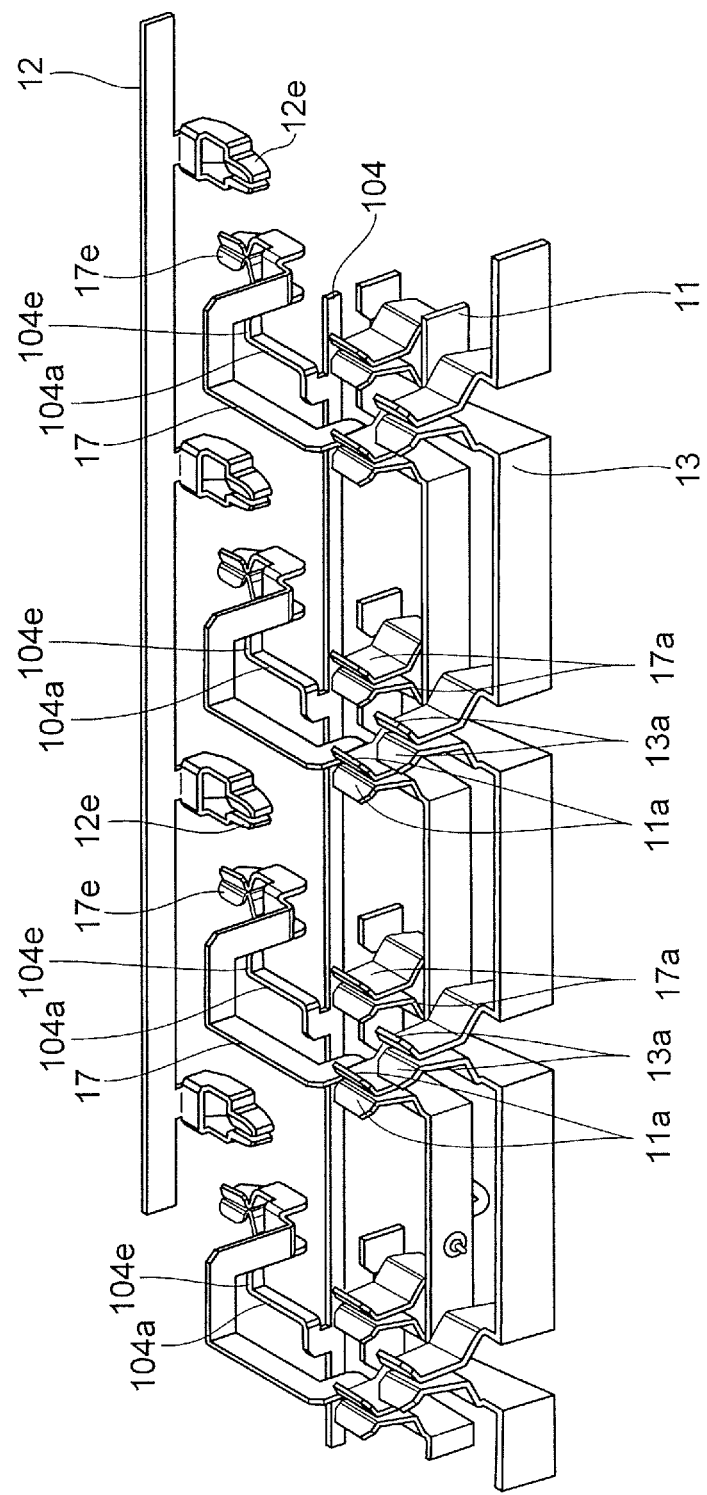
FIG. 22 is a perspective view of the configuration in FIG. 21 with a first circuit board, switches, and the covers removed.

FIG. 22 is a perspective view of the configuration in FIG. 21 with the first circuit board 20, the switches 102, and the covers 108 removed.

In FIG. 22, elements having the same functions as those described in the first embodiment are given the same reference numerals as in the first embodiment, and the description thereof is omitted below.

As illustrated in FIG. 22, the second bus bar 12 is provided with fourth contacts 12e and tip ends of the branch bars 17 are provided with fifth contacts 17e in this embodiment.

Moreover, in addition to the first to third bus bars 11 to 13, an auxiliary bar 104 is provided to supply power to light sources such as LEDs included inside the respective switches 102.

The auxiliary bar 104 is fabricated by die-cutting a metal plate such as a brass plate and then bending it, and includes a plurality of branches 104a corresponding to the respective switches 102. In addition, at a tip end of each branch 104a, a sixth contact 104e is formed to bend in a direction perpendicular to an extending direction of the branch 104a.

Figure 23:
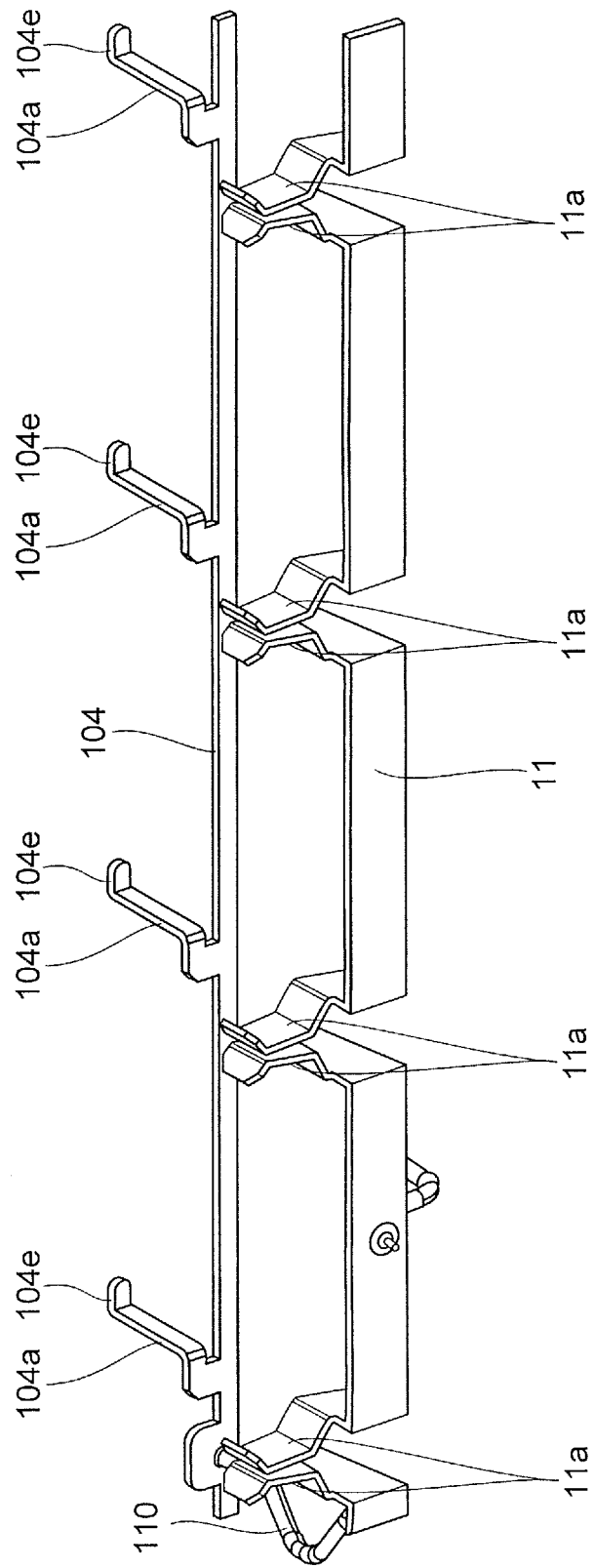
FIG. 23 is a perspective view of a first bus bar and an auxiliary bar according to the fifth embodiment.

FIG. 23 is a perspective view of the first bus bar 11 and the auxiliary bar 104.

As illustrated in FIG. 23, the first bus bar 11 and the auxiliary bar 104 are electrically connected to each other by a connection cable 110 and thereby are set to have an equal electrical potential.

Figure 24:
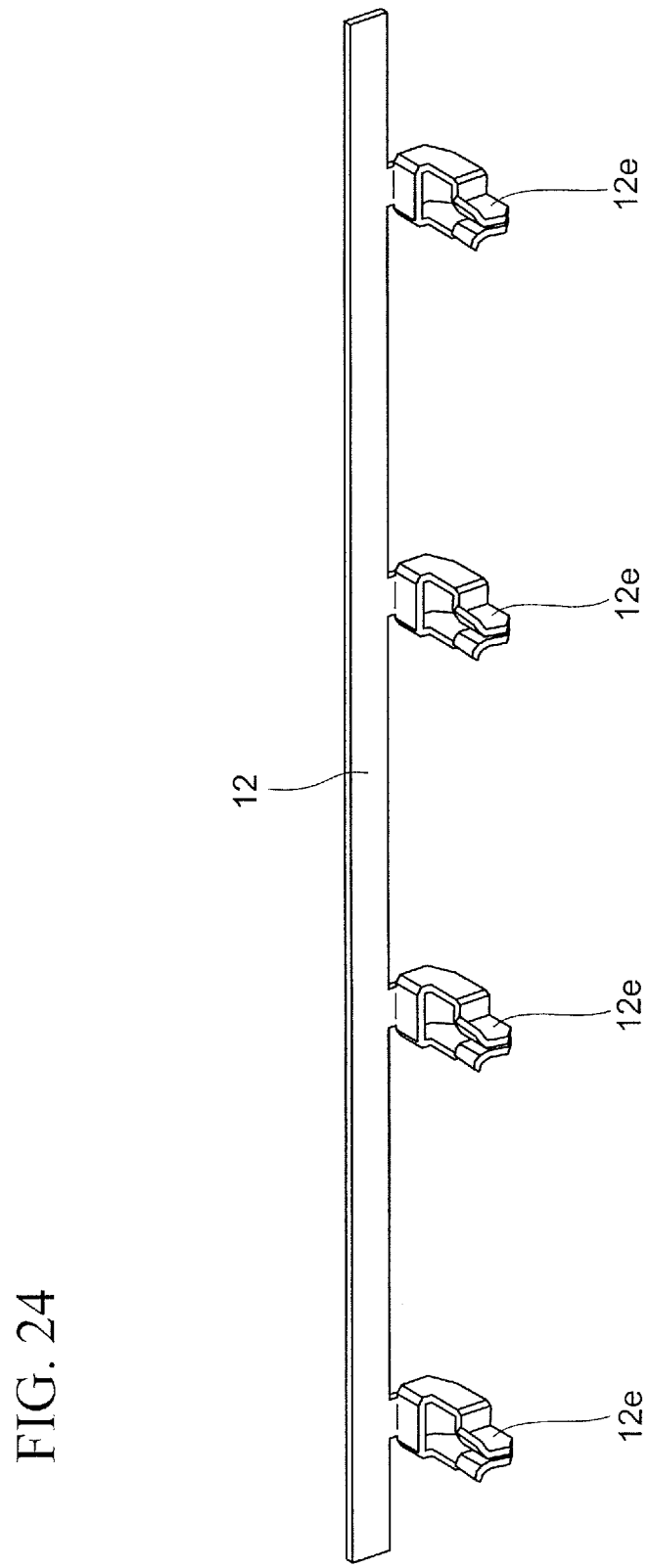
FIG. 24 is a perspective view of a second bus bar according to the fifth embodiment.
Figure 25:
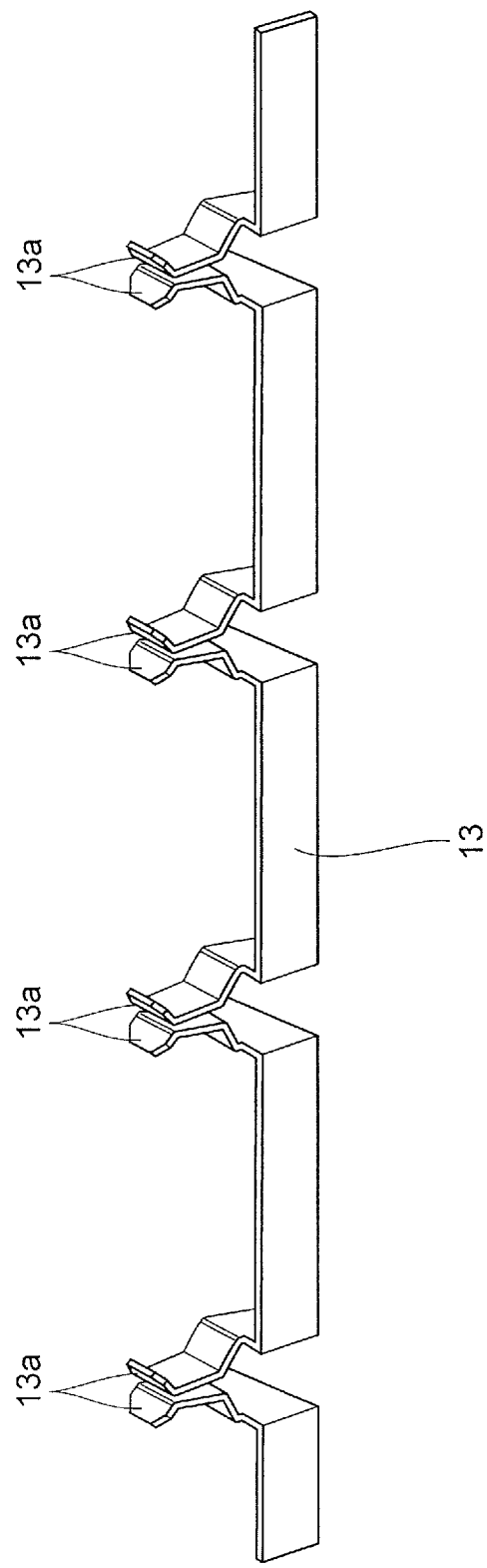
FIG. 25 is a perspective view of a third bus bar according to the fifth embodiment.

On the other hand, FIG. 24 is a perspective view of the second bus bar 12, and FIG. 25 is a perspective view of the third bus bar 13.

These bus bars 12, 13 are also each fabricated by die-cutting a metal plate such as a brass plate and then bending it.

Figure 26:
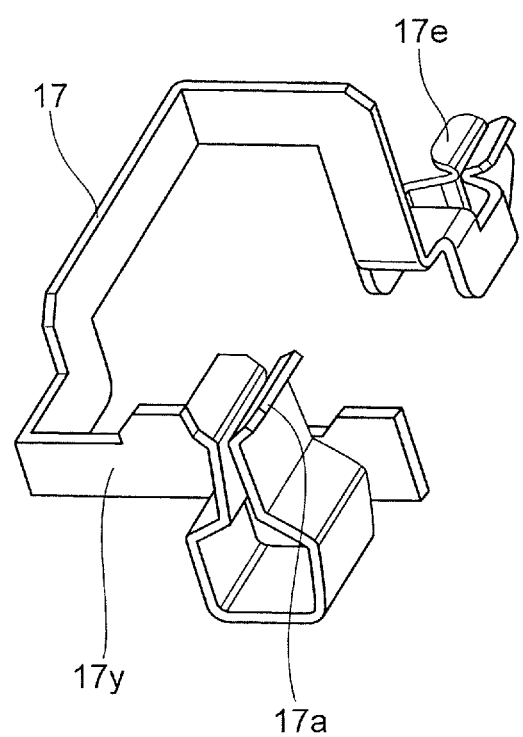
FIG. 26 is a perspective view of a branch bar according to the fifth embodiment.

In addition, FIG. 26 is a perspective view of the branch bar 17 according to this embodiment.

Figure 27:
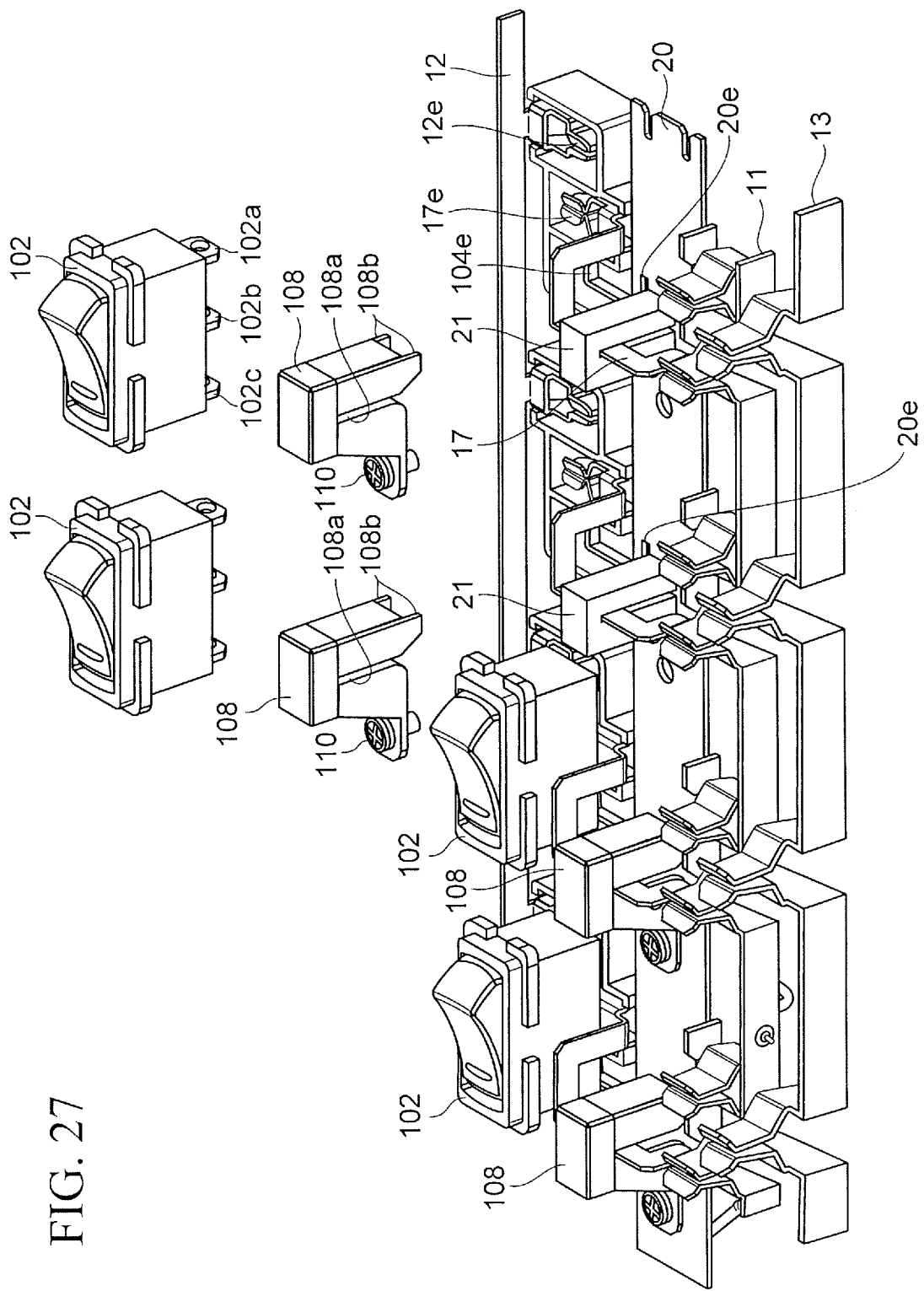
FIG. 27 is an exploded perspective view of the power strip according to the fifth embodiment.

As illustrated in FIG. 26, an extending portion 17y of the second contact 17a is provided at an end portion of the branch bar 17. FIG. 27 is an exploded perspective view of the power strip 101.

As illustrated in FIG. 27, each cover 108 has a size enough to house the magnetic core 21 therein and includes a slit 108a through which the branch bar 17 is inserted.

In addition, a bottom portion of the cover 108 is provided with two joint projections 108b. The joint projections 108b are fitted into joint holes 20e provided to the first circuit board 20, whereby the cover 108 and the first circuit board 20 are positioned.

The cover 108 is provided for each magnetic core 21, and is fixed to the first circuit board 20 with the screw as described above. This fixation improves the stability of the magnetic core 21 on the first circuit board 20.

On the other hand, the switch 102 is provided with first to third terminals 102a to 102c. These terminals 102a to 102c are fitted to the fourth contact 12e, the fifth contact 17e, and the sixth contact 104e, respectively.

Figure 28:
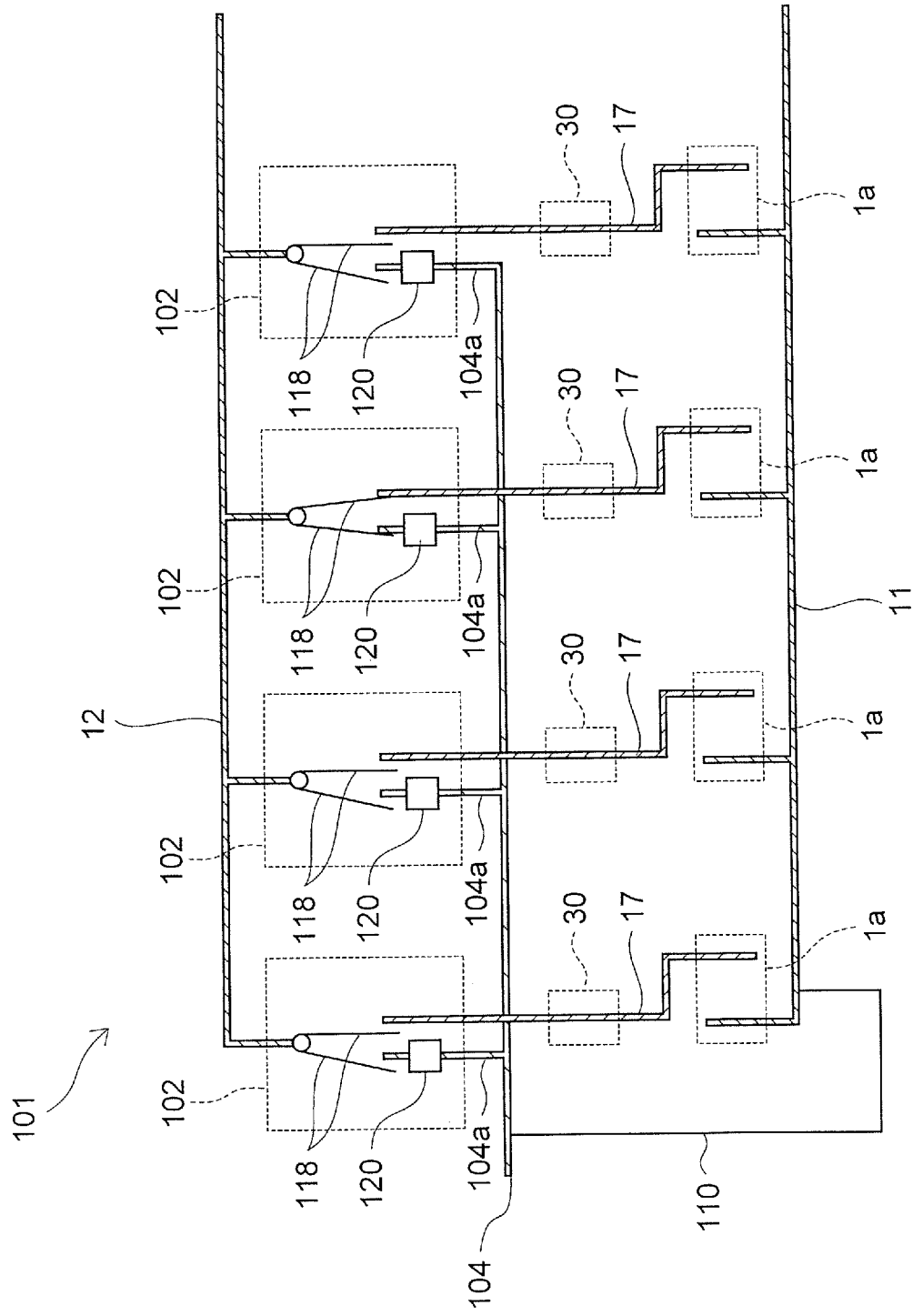
FIG. 28 is a circuit diagram of the power strip according to the fifth embodiment.

FIG. 28 is a circuit diagram of the power strip 101 including the switches 102. In FIG. 28, the third bus bar 13 serving as an earth line is omitted.

As illustrated in FIG. 28, each switch 102 includes a light source 120 and two conductive blades 118. These conductive blades 118 are mechanically connected to the button 102x (see FIG. 21). When the switch 102 is turned into the ON state by an operation of the button 102x, the branch bar 17 and the branch 104a are electrically connected to the second bus bar 12 at the same time.

When the switch 102 becomes in the ON state as described above, the light source 120 emits light to illuminate the whole of the translucent button 102x (see FIG. 21) with the light, and thereby a user knows that the switch 102 is in the ON state.

Here, the power strip 101 according to this embodiment includes a transmitter circuit section 27 having the same circuit configuration as in FIG. 8, and is able to perform the same power measurement method as in the first embodiment.

According to the embodiment described above, the switch 102 is provided to each jack portion 1a as illustrated in FIG. 20. With this configuration, when an electrical device connected to a jack portion 1a is unused, the switch 102 corresponding to the jack portion 1a is turned off to cut off power supply to the electrical device from the jack portion 1a. In this way, the standby power consumption of the electrical device may be cut off.

Moreover, as illustrated in FIG. 27, the magnetic cores 21 are housed inside the covers 108 and the covers 108 are fixed to the first circuit board 20. Thereby, the magnetic cores 21 are less likely to be displaced on the circuit board 20, and thereby the stability of attachment of the magnetic cores 21 to the circuit board 20 is improved.

Although the embodiments are described in detail hereinabove, the embodiments are not limited to the above description.

For example, the above description is provided for the cases where the power strips 1, 101 are each provided with a plurality of jack portions 1a as illustrated in FIGS. 1 and 20, but one jack portion 1a may be provided to the power strip 1 or 101.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power strip comprising:
   a jack portion;
   a current meter configured to measure a current being supplied from the jack portion to an external electrical device, and to output a measurement signal corresponding to a magnitude of the current; and
   a computing unit configured to obtain instantaneous values of the current at a plurality of time points on the basis of the measurement signal, and to calculate a power value using the instantaneous values,
   wherein the computing unit is configured to obtain the instantaneous values of the current by using any one of a first zero point and a second zero point as a reference.

2. The power strip according to claim 1, the power strip further comprising a storage unit configured to store at least any one of the first zero point and the second zero point.

3. The power strip according to claim 1, wherein:
   the first zero point is a fixed value, and
   the second zero point is a middle point between the maximum value and the minimum value of the measurement signal within a predetermined period.

4. The power strip according to claim 3, wherein:
   a plurality of the jack portions are provided,
   a plurality of the current meters are provided corresponding to the jack portions, respectively, and
   the computing unit obtains the maximum value and the minimum value for each of the jack portions.

5. The power strip according to claim 3, wherein:
   a plurality of the jack portions are provided,
   a plurality of the current meters are provided corresponding to the jack portions, respectively, and
   the fixed value is determined in advance for each of the jack portions.

6. The power strip according to claim 3, wherein the fixed value is a value of the measurement signal under a condition where no load is connected to the jack portion.

7. The power strip according to claim 1, wherein:
   the current meter includes a hall element to be exposed to a magnetic field generated by the current, and
   the measurement signal is an output voltage of the hall element.

8. The power strip according to claim 7, wherein:
   the current meter includes a bar through which the current flows, and a magnetic core surrounding the bar and having a gap therein, and
   the hall element is provided inside the gap.

9. The power strip according to claim 8, wherein a magnetic sensing plane of the hall element is in parallel with an extending direction of the bar.

10. The power strip according to claim 1, wherein:
    a plurality of the jack portions are provided,
    a plurality of the current meters are provided corresponding to the jack portions, respectively, and
    the computing unit obtains an effective value of the current from the instantaneous values of the current, and calculates the power value for each of the jack portions by using the effective value.

11. The power strip according to claim 10, wherein the computing unit calculates an apparent power value as the power value by multiplying an effective value of a power supply voltage by the effective value of the current.

12. The power strip according to claim 11, the power strip further comprising:
    a first power line;
    a first contact electrically connected to the first power line, and configured to receive one of plug blades of the electrical device;
    a second power line between which and the first power line a power supply voltage is applied; and
    a second contact electrically connected to the second power line and configured to receive another plug blade of the electrical device.

13. The power strip according to claim 12, the power strip further comprising:
    a photocoupler including a light emitting diode electrically connected between the first power line and the second power line, the photocoupler configured to output an output signal whose level is changed when the power supply voltage exceeds a threshold,
    wherein, the computing unit determines a sampling frequency by evenly dividing a cycle of the output signal, and obtains the instantaneous values at the plurality of time points at the sampling frequency.

14. The power strip according to claim 1, the power strip further comprising an output port electrically connected to the computing unit and configured to output output data including the power value to outside.

15. A power measurement method comprising:
    obtaining measured values of a current at a plurality of time points, the current being supplied from each of a plurality of jack portions to an external electrical device, and thereby acquiring a measurement signal corresponding to the measured values;
    obtaining instantaneous values of the current at the plurality of time points from the measurement signal by using any one of a first zero point and a second zero point as a reference; and
    calculating a power value individually for each of the plurality of jack portions by using the instantaneous values.

16. The power measurement method according to claim 15, the power measurement method further comprising:
    obtaining, as the second zero point, a middle point between the maximum value and the minimum value of the measurement signal within a predetermined period; and
    determining if a difference between the first zero point and the second zero point is equal to or larger than a reference value, wherein;
    the instantaneous values are obtained by using the second zero point as the reference when the difference is smaller than the reference value, and
    the instantaneous values are obtained by using the first zero point as the reference when the difference is equal to or larger than the reference value.

17. The power measurement method according to claim 16, wherein a fixed value determined in advance for each of the jack portions is used as the first zero point.

18. The power measurement method according to claim 17, wherein a value of the measurement signal under a condition where no load is connected to the jack portion is used as the fixed value.

19. The power measurement method according to claim 15, wherein:
- a hall element is exposed to a magnetic field generated by the current, and
- an output voltage outputted from the hall element is acquired as the measurement signal.

20. The power measurement method according to claim 15, wherein the power value is calculated by obtaining an effective value of the current from the instantaneous values of the current, and by multiplying the effective value by an effective value of a power supply voltage.

* * * * *